United States Patent
Schmitt et al.

(10) Patent No.: US 7,002,419 B2
(45) Date of Patent: Feb. 21, 2006

(54) METAL PROGRAMMABLE PHASE-LOCKED LOOP

(75) Inventors: Jonathan A. Schmitt, Bloomington, MN (US); Carol F. Gillies, Arden Hills, MN (US)

(73) Assignee: LSI Logic Corporation, Milpitas, CA (US)

( * ) Notice: Subject to any disclaimer, the term of this patent is extended or adjusted under 35 U.S.C. 154(b) by 143 days.

(21) Appl. No.: 10/662,188

(22) Filed: Sep. 15, 2003

(65) Prior Publication Data

US 2005/0057975 A1    Mar. 17, 2005

(51) Int. Cl.
*H03L 7/08* (2006.01)
(52) U.S. Cl. .................... 331/25; 331/1 A; 331/17; 331/36 C
(58) Field of Classification Search ................ 331/1 A, 331/2, 14, 17, 18, 25, 36 C, 49, 74, 75, 108 C, 331/179, 187; 327/156–159; 332/127; 360/57; 375/376; 455/260
See application file for complete search history.

(56) References Cited

U.S. PATENT DOCUMENTS 6,770,949 B1 * 8/2004 Eltoukhy ................. 257/536
6,823,499 B1 * 11/2004 Vasishta et al. ............. 716/8

* cited by examiner

*Primary Examiner*—David Mis
(74) *Attorney, Agent, or Firm*—Westman, Champlin & Kelly

(57) ABSTRACT

A phase-locked loop within an integrated circuit assembly is provided. The phase-locked loop includes a plurality of subcells of semiconductor devices arranged in a base layer pattern on base layers of the integrated circuit assembly. One or more metal layers are formed over and interconnect the plurality of semiconductor devices in a metallization pattern. The phase-locked loop has an output frequency range that is changeable with a change to the metallization pattern without a corresponding change to the base layer pattern.

16 Claims, 19 Drawing Sheets

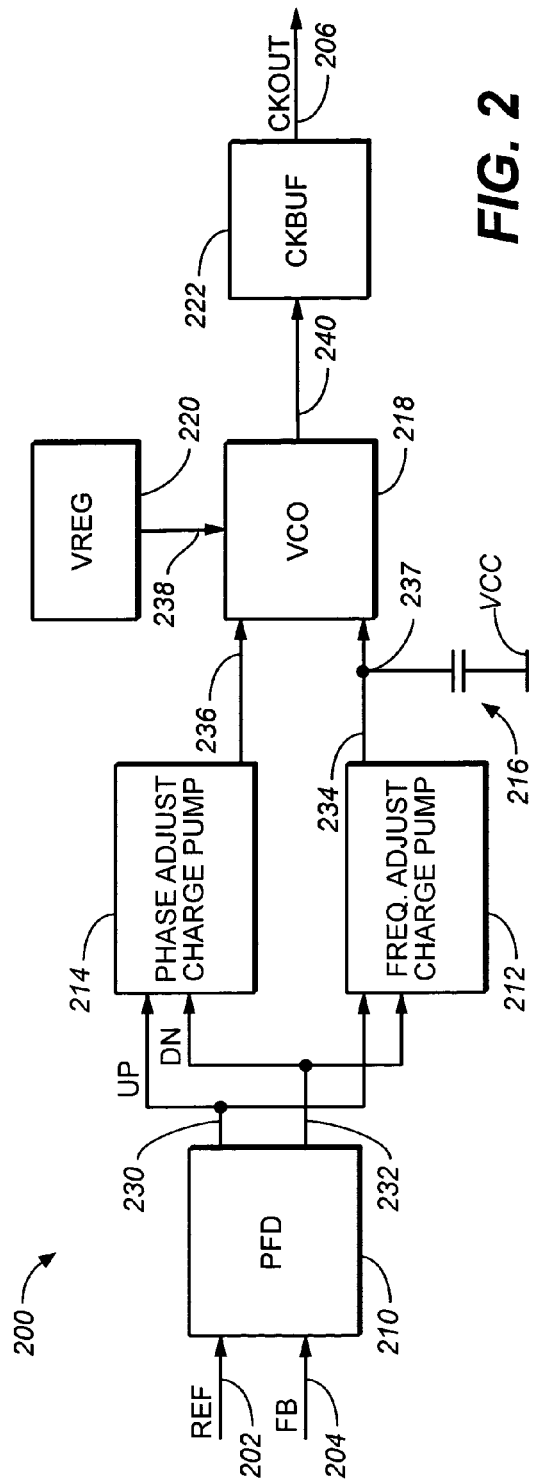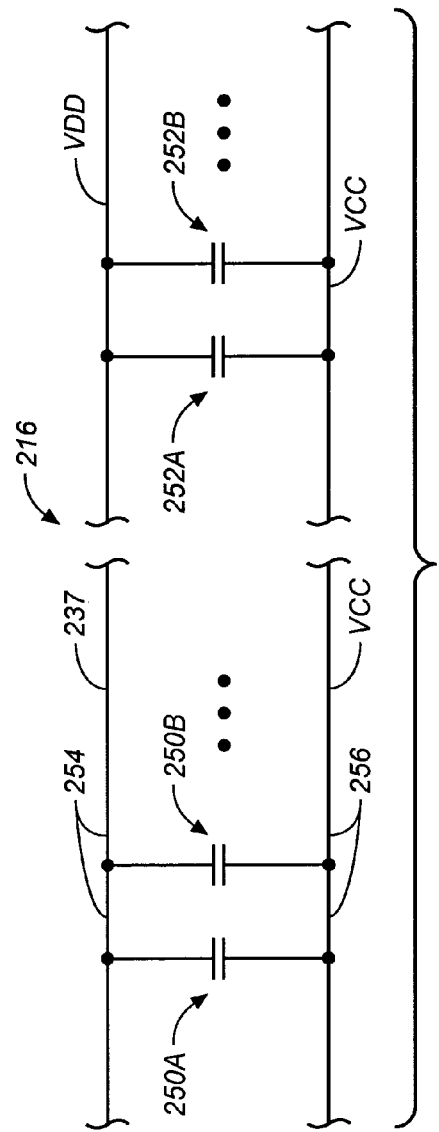

METAL PROGRAMMABLE PHASE-LOCKED LOOP

FIELD OF THE INVENTION

The present invention relates to semiconductor integrated circuits and more particularly to implementation of phase-locked loops having different operating characteristics.

BACKGROUND OF THE INVENTION

Integrated circuits are generally fabricated on a thin, circular silicon wafer or substrate. Semiconductor devices and electrical interconnections that form the integrated circuit are conventionally made by building many mask layers on top of one another on the substrate. Each successive mask layer may have a pattern that is defined using a mask. A mask has a shape used for processing features in a particular process step during fabrication. The mask layers are fabricated through a sequence of pattern definition steps using the masks, which are interspersed with other process steps such as oxidation, etching, doping and material deposition. When a mask layer is defined using a mask chosen or provided by a customer, the mask layer is programmed or customized.

The lowest, "base" layers include the active areas of the semiconductor devices, such as diffusion regions and gate oxide areas, and desired patterns of the polysilicon gate electrodes. One or more metal and insulating layers are then deposited on top of the base layers and patterned to form conductive segments, which interconnect the various semiconductor devices formed in the base layers. Electrical contacts or vias are formed to electrically connect a conductive segment of one of the metal layers with a conductive segment or semiconductor device on one of the other layers on the wafer.

An application specific integrated circuit (ASIC) is an integrated circuit designed specifically for a particular application or use. There are three categories of ASICs in terms of programmability of mask layers: fully programmable ASICs, non-programmable ASICs, and semi-programmable ASICs. In a fully programmable ASIC, all mask layers are programmed or customized. A typical example of a fully programmable ASIC is a cell-based ASIC (CBIC). In a non-programmable ASIC, none of the mask layers are programmed or customized, and all mask layers are pre-fabricated by an ASIC vendor. A typical example of a non-programmable ASIC is a field-programmable gate array (FPGA). In a semi-programmable ASIC, some, but not all, mask layers are programmable. A typical example of a semi-programmable ASIC is a gate-array-based ASIC. A semi-programmable ASIC can combine the high-density, high-performance benefits of standard-cell ASICs with the fast time-to-market and customization benefits of FPGAs.

Higher-level logic functions, such as phase-locked loops, are typically implemented as standard cells so they can be optimized for a desired operating frequency range. It is therefore common for ASIC vendors to include several versions of a phase-locked-loop cell, each with different operating characteristics, in a cell library so that the appropriate cell can be selected for a particular application. However, each PLL cell may have different base layer and metal layer patterns since they are implemented as standard cells. This increases the design and fabrication cycle times since the base layer masks and lower metal layer masks may change depending upon which PLL cell is selected.

Phase-locked loop cells are therefore desired, which allow for reduction in the design and fabrication cycle times associated with the implementation of these cells on a integrated circuit.

SUMMARY OF THE INVENTION

One embodiment of the present invention is directed to a phase-locked loop (PLL) within an integrated circuit assembly. The PLL includes a plurality of subcells of semiconductor devices arranged in a base layer pattern on base layers of the integrated circuit assembly. One or more metal layers are formed over and interconnect the plurality of semiconductor devices in a metallization pattern. The phase-locked loop has an output frequency range that is changeable with a change to the metallization pattern without a corresponding change to the base layer pattern.

Another embodiment of the present invention is directed to a PLL cell for fabrication on an integrated circuit. The cell definition includes first and second PLL configurations. The first PLL configuration is formed by a first plurality of subcells, wherein each of the first plurality of subcells comprises a base layer pattern and a metallization pattern. The second PLL configuration is formed by a second plurality of subcells. At least one of the second plurality of subcells is common with a corresponding one of the first plurality of subcells and has the same base layer pattern and the same metallization pattern. At least one other of the second plurality of subcells is common with a corresponding one of the first plurality of subcells and has the same base layer pattern and a different metallization pattern.

BRIEF DESCRIPTION OF THE DRAWINGS

FIG. 2 is a block diagram illustrating a programmable PLL cell, according to one embodiment of the present invention.

FIG. 3 is a schematic diagram illustrating programmability of a loop filter in the PLL cell, according to one embodiment of the present invention.

DETAILED DESCRIPTION OF ILLUSTRATIVE EMBODIMENTS

Figure 1:
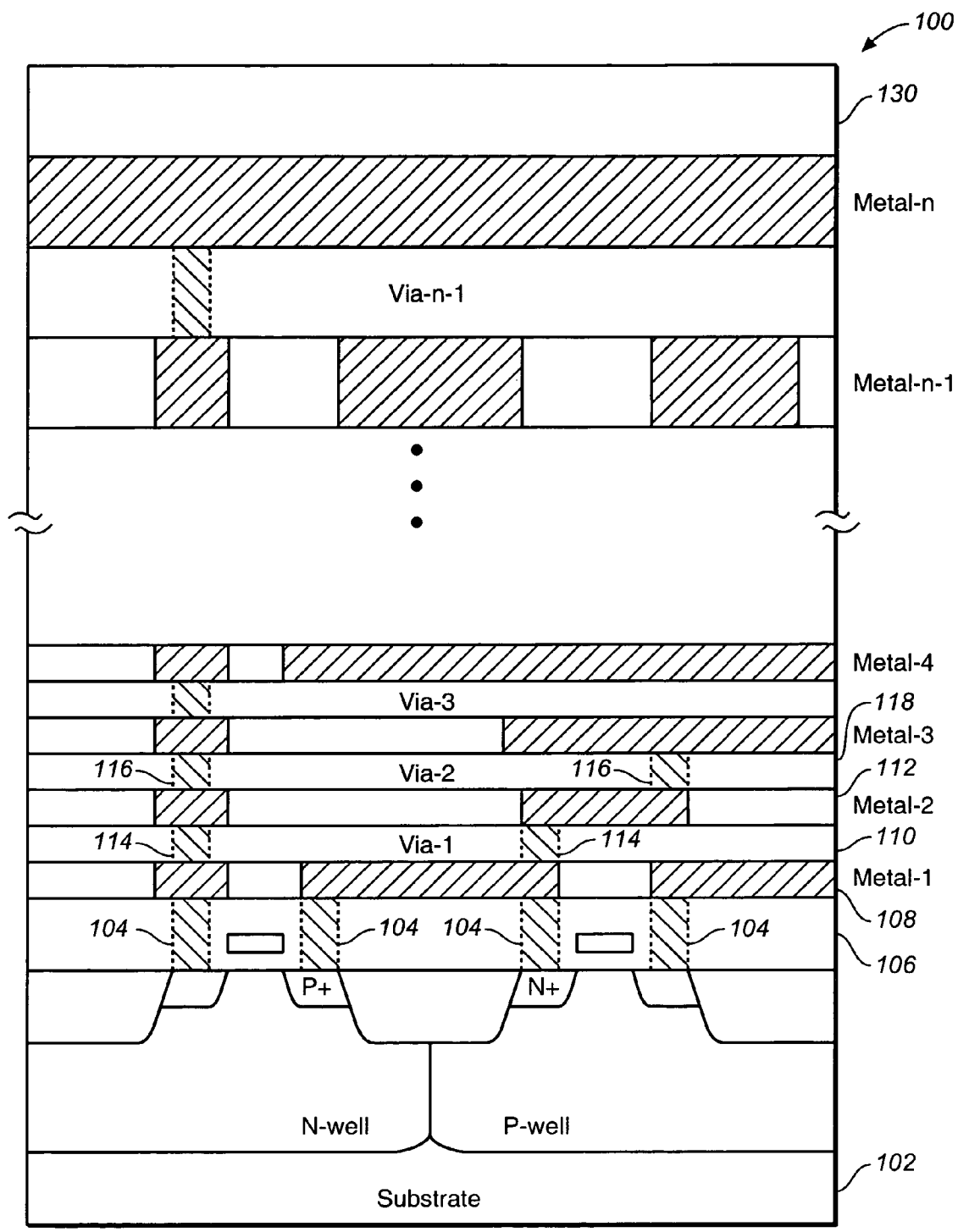
FIG. 1 is a schematic diagram illustrating a partial cross-sectional view of an exemplary ASIC in which the present invention may be implemented.

FIG. 1 is a schematic diagram illustrating a partial cross-sectional view of an exemplary ASIC 100 in which the present invention may be implemented. ASIC 100 may be formed on a semiconductor substrate 102. Those of the ordinary skill in the art will understand that a number of photolithography masks may be used to form semiconductor devices, which are building blocks of logic gates and other circuits. Such masks may be used for forming buried layers and isolation (e.g., well structures), diffusion regions, gate electrodes and the like. FIG. 1 shows two of such semiconductor devices. After the semiconductor devices are formed, a contact layer 106 is formed on top of the semiconductor devices by growth or deposition of insulating materials. Contact holes or "vias" 104 are then formed within contact layer 106 and metal is deposited inside the contact holes. Contact layer 106 is used to provide input and output connections to the semiconductors formed on substrate 102. The layers formed on substrate 102 through contact layer 106 are known as "base layers", and the masks used to pattern these features and their input and output contacts are known as "base layer masks".

After the base layers have been fabricated on substrate 102, a metal layer 108 (Metal-1) is deposited on top of contact layer 106 and then patterned so that metal remains only in desired locations or patterns (known as a "metallization" pattern). Then, an insulation layer 110 (Via-1) is formed on top of Metal-1 layer 108. Vias 114 are formed within Via-1 layer 110, and metal is deposited inside vias 114. Then, a second metal layer 112 (Metal-2) is deposited on top of Via-1 layer 110 and patterned so that metal remains only in desired locations. An insulation layer (Via-2) 118 is formed on top of Metal-2 layer 112. Vias 116 are formed within Via-2 layer 118 and metal is deposited inside the vias 116. This process can be repeated for each metal layer and insulation layer required to be formed. As shown, ASIC 100 can include "n" metal layers (Metal-1 to Metal-n), n–1 Vias (Via-1 to Via-n–1), and one contact layer. A surface passivation layer 130 can be formed on top of the metal layer, Metal-n. Any number of layers can be used in alternative embodiments of the present invention.

The metallization pattern in each metal routing layer forms one or more conductive segments that can be used for interconnecting the semiconductor devices formed on substrate 102. Typically, the conductive segments in one metal routing layer are orientated orthogonally to the conductive segments in the next adjacent metal routing layer.

The contacts of each semiconductor device on the integrated circuit are connected to the contacts of other semiconductor devices or features on the integrated circuit through one or more conductive "nets". These nets are formed by conductive segments on one or more metal layers, Metal-1 to Metal-n, which are connected through one or more of the vias, such as vias 114 or 116. The location of each conductive segment and via that is formed on the integrated circuit is defined by the photolithography masks used to form the routing layers and the vias.

As semiconductor technologies advance and become more complex, the costs associated with manufacturing each of these masks have increased significantly. The degree to which each mask is customized for a particular application further increases the costs associated with manufacturing the mask and increases its design time. Therefore, it is desired to reduce the level of customization of certain logic function while still providing the customer with wide ranges of operating characteristics.

According to one embodiment of the present invention, a phase-locked loop (PLL) cell is provided, which has a fixed base layer pattern and an operating frequency range that is programmable through changes in one or more of the metal layers and/or via layers. In one embodiment, the output frequency range of the PLL cell is programmable through changes in only Metal-1 layer 108, Metal-2 layer 112, Via-1 layer 110 and Via-2 layer 118. Base layers 102 to 106 remain fixed.

The programmability is accomplished by arranging the PLL cell into a plurality of subcells, which can be electrically coupled in a plurality of different configurations for achieving a desired performance characteristic. The PLL cell includes various different types of subcells, including subcells that are common to each PLL configuration and have the same base layer pattern and the same metal layer pattern, subcells with common base layer patterns and different metal layer patterns, and unique subcells with different base layer patterns and different metal layer patterns. All subcells are present in the PLL cell such that the overall base layer pattern of the PLL cell is fixed. Changes in operating characteristics are implemented by changing the metal layer patterns to alter the interconnections within one or more subcells or to operatively couple or decouple any unique subcells into our out of the PLL cell.

FIG. 2 is a block diagram illustrating a programmable PLL cell 200 according to one embodiment of the present invention. PLL cell 200 includes a reference input 202 (labeled REF), a feedback input 204 (labeled FB), and a clock output 206 (labeled CKOUT). PLL cell 200 is formed of a plurality of subcells, including phase/frequency detector 210, a frequency adjust charge pump 212, a phase adjust charge pump 214, a loop filter 216, a voltage-controlled oscillator (VCO) 218, a voltage regulator 220 and a clock buffer 222.

Phase/frequency detector 210 is coupled to reference input REF and feedback input FB and has control outputs 230 and 232. Control outputs 230 and 232 are coupled to the inputs of charge pumps 212 and 214. Charge pump 212 has an output 234 coupled to loop filter node 237 and a first input to VCO 218. Loop filter 216 is coupled between loop filter node 237 and ground terminal VCC. Charge pump 214 has an output 236, which is coupled to a second input to VCO 218. Voltage regulator 220 generates a voltage/current bias output 238 for biasing VCO 218. VCO 218 has a clock output 240, which is coupled to the input of clock buffer 222. Clock buffer 222 generates clock output CKOUT.

During operation, VCO 218 generates a differential clock signal on clock output 240, which has a phase and frequency that are a function of the voltage across loop filter 218 and current supplied through output 236 of charge pump 214. Clock buffer 222 shifts the peak-to-peak voltage levels of clock output 240 toward the positive and negative voltage supply rails and adds additional drive strength for clock output CKOUT. In one embodiment, clock buffer 222 is configured to divide the frequency of clock output 240 by a programmable divisor.

The resulting clock output signal CKOUT can be coupled directly to feedback input FB or can be coupled through a suitable frequency divider. The frequency divider can be internal or external to clock buffer 222. Phase/frequency detector 210 detects a phase/frequency difference between reference input REF and feedback input FB. Phase/frequency detector 210 can include a variety of detectors such as a three-state type detector, which generates "UP" and "DOWN" signals on outputs 230 and 232 as a function of the phase/frequency difference between reference input REF and feedback input FB. In one embodiment, the UP and DOWN signals are pulse-width modulated as a function of the phase/frequency difference. Charge pump 212 pumps charge onto loop filter 216, pumps charge off of loop filter 216, or does not change the charge on loop filter 216 as a function of the Up and DOWN signals. VCO 218 then responsively increases, decrease or does not change the frequency of oscillation on clock output 240 as a function of the voltage across loop filter 216. Phase adjust charge pump 214 pumps charge into and out of VCO 18 on a cycle-by-cycle basis to align the phase of feedback input FB to the phase of reference input REF.

One or more of the subcells of PLL cell 200 are programmable to provide different frequency ranges on clock output CKOUT. These frequency ranges are programmable through changes in the metallization pattern of PLL cell 200, such as within metal layers Metal-1 and Metal-2, with no changes to the base layers of PLL cell 200. For example in one embodiment, PLL cell 200 can be implemented in one of four different circuit configuration for providing output frequency ranges of 60–300 MHz, 100–500 MHz, 400–800 MHz, and 600–1250 MHz. However, any other number of circuit configurations can be used in alternative embodiments of the present invention, and the particular frequency ranges are provided as examples only.

In one embodiment, the phase/frequency detector 210 and charge pump 212 are implemented as common subcells to all PLL circuit configurations. In other words, these subcells are shared by all PLL circuit configurations and have the same base layer pattern and the same metallization pattern in each configuration. Charge pump 214 is implemented as a subcell having a common subcell with the same base layer pattern in all PLL circuit configurations, but a metallization pattern that is programmable to select the drive strength on output 236. For example, the metallization pattern can be modified to couple or decouple one or more output transistors in the base layer pattern in parallel with one another. Any unused output transistors can be tied-off within the respective metallization pattern.

Similarly, voltage regulator 220 and clock buffer 222 implemented as common subcells with the same base layer patterns in all PLL circuit configurations, but with metallization patterns that are programmable to modify selected characteristics such as bias levels, output levels or frequency divisors. VCO 218 is implemented with separate, unique VCO subcells for use in the different PLL configurations. The PLL base layer pattern includes all unique VCO subcells, but each unique VCO subcell is either coupled into or coupled out of the PLL circuit through changes in the metallization pattern of the PLL cell.

FIG. 3 is a schematic diagram illustrating the programmability of loop filter 216 according to one embodiment of the present invention. Loop filter 216 has one or more capacitors 250A, 250B, etc., which are operatively coupled together in parallel between loop filter node 237 and ground terminal VCC. Loop filter 216 further includes one or more unused capacitors 252A, 252B, etc., which are operatively decoupled from loop filter node 237. In the embodiment shown in FIG. 3, unused capacitors 252A, 252B, etc. are electrically coupled between voltage supply rails VDD and VCC for use as power supply decoupling capacitors.

Any number of the capacitors 250 and 252 can be coupled to or decoupled from loop filter node 237 through changes to the metallization pattern. For example, conductive segments 254 and 256 can be included in one configuration to couple capacitor 250B in parallel with capacitor 250A or eliminated in another configuration to decouple capacitor 250B from capacitor 250A. Conductive segments 254 and 256 can be replaced with other conductive segments (not shown), which couple capacitor 250B between voltage supply rails VDD and VCC, for example.

This allows the loop filter capacitance to be programmable with each PLL configuration through changes to the metallization pattern. However, since all of the capacitors 250 and 252 are present in each loop filter configuration, loop filter 216 has the same base layer pattern for all PLL configurations. The only requirement is that the base layer pattern must include the largest number of capacitors 250 and 252 that are needed by any particular loop filter configuration.

Referring back to FIG. 2, VCO 218 can be programmed to oscillate within three different oscillation frequency ranges, in one embodiment of the present invention. The three VCO configurations are accomplished by including three separate VCO base layer patterns in the layout of PLL 200 as three separate subcells. As mentioned above, each of the three VCO subcells has a different VCO base layer pattern and a different VCO metallization pattern. The desired VCO subcell is operatively coupled into PLL 200 through conductive segments in metal layers Metal-1 and Metal-2, for example, and the remaining unused VCO subcells are tied-off through respective conductive segments in the Metal-1 and Metal-2 layers. In an alternative embodiment, each of the three VCO subcells can share one or more elements in the base layers so that the overall area consumed by the VCO subcells is reduced. The coupling of the VCO subcells into and out of the PLL circuit is shown and described in greater detail below with reference to FIGS. 13–16.

Figure 4:
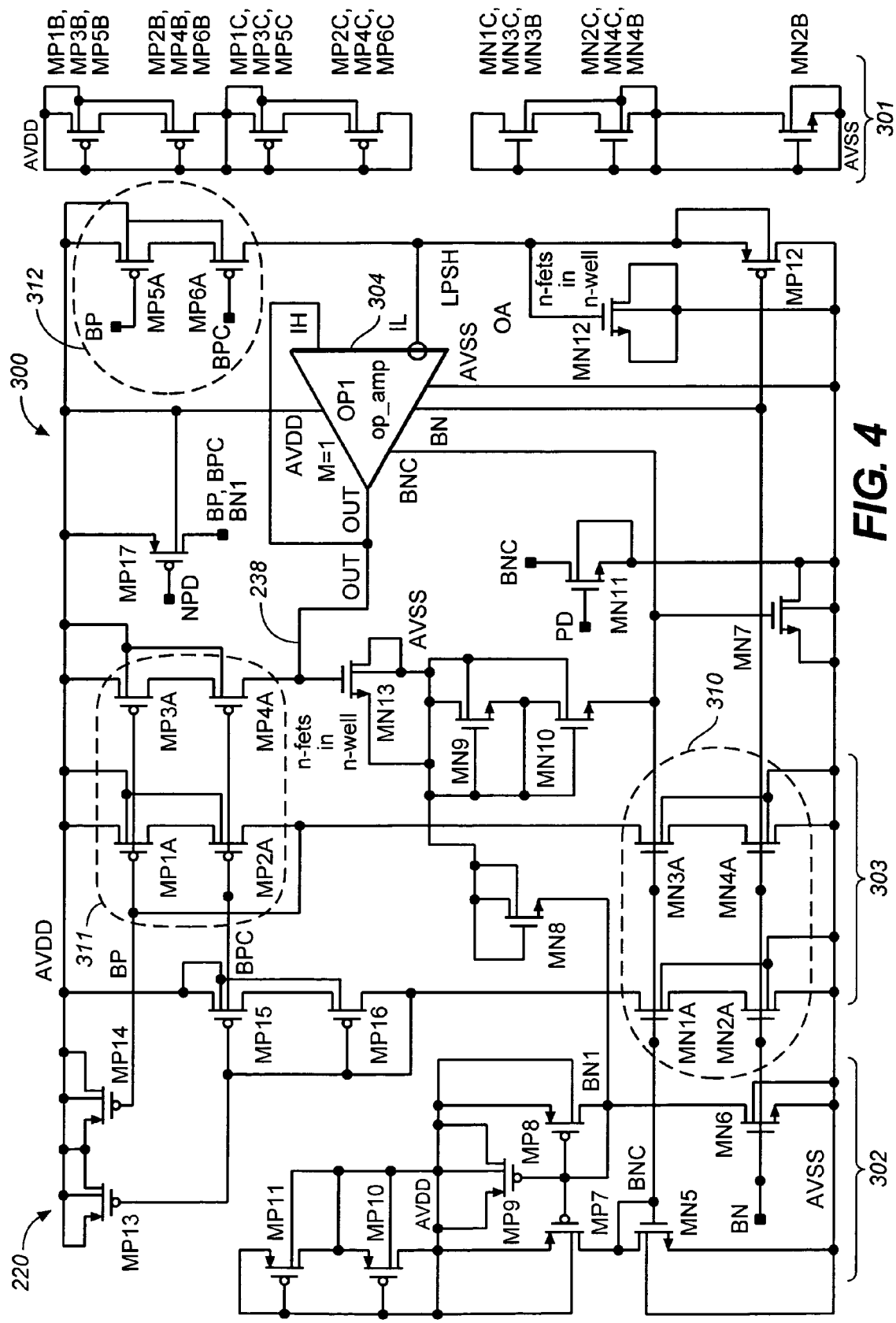
FIGS. 4–6 are schematic diagrams illustrating respective configurations of a voltage regulator in the PLL cell, according to one embodiment of the present invention.
Figure 5:
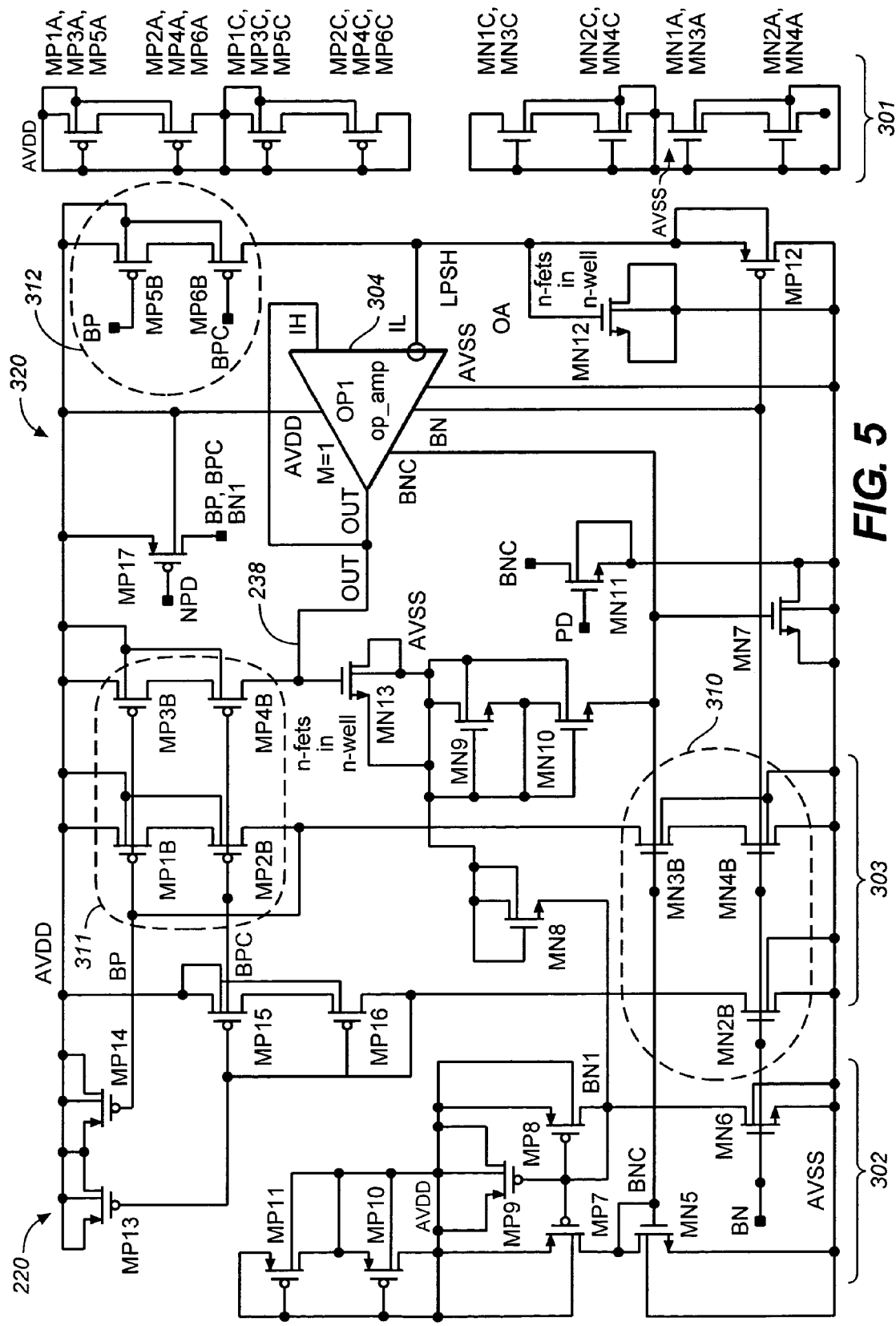
Figure 6:
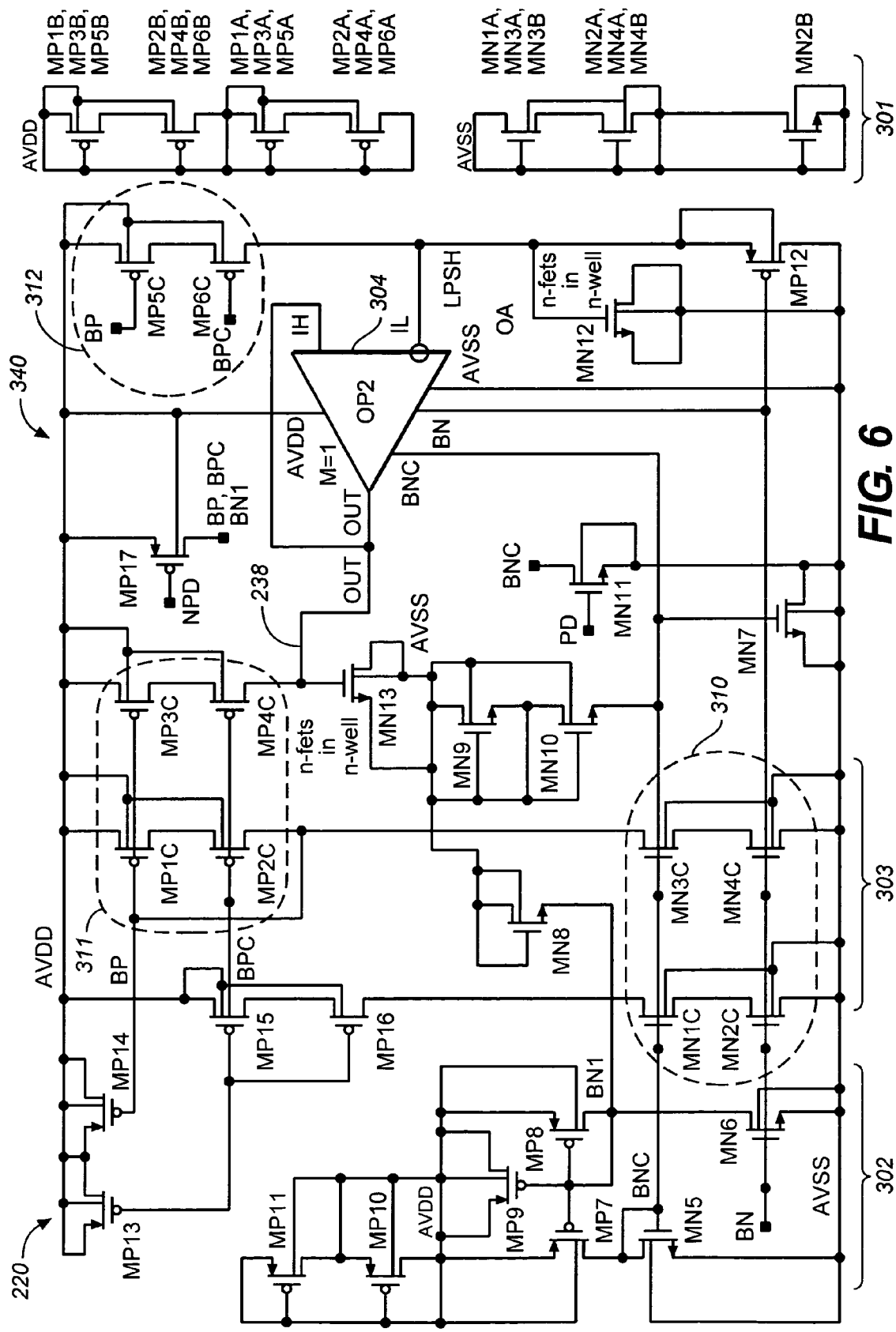

With respect to voltage regulator 220, FIGS. 4–6 are schematic diagrams illustrating the three programmable configurations. The same reference numerals are used in FIGS. 4–6 for the same or similar elements. FIG. 4 illustrates voltage regulator 220 in a configuration 300, according to one embodiment of the present invention. Voltage regulator 220 includes N-Channel transistors MN1–MN13, P-Channel transistors MP1–MP17 and operational amplifier 304 having a first configuration OP1.

All transistors MN1–MN13 and MP1–MP17 are present in the base layer layout pattern of voltage regulator 220 for configuration 300, but not all of the transistors are operatively coupled into the regulator circuit. Bracket 301 illustrates those transistors that are operatively decoupled from the regulator circuit. In configuration 300, these unused transistors include MN2B–MN4B, MN1C–MN4C, MP1B–MP6B and MP1C–MP6C. The remaining transistors are operatively coupled into the regulator circuit.

Voltage regulator 220 has control voltage input BN and bias output 238, labeled OUT. Control voltage input BN is coupled to the gates of bias transistors MN6, MN2A, and MN4A for setting the bias voltage on OUT, which is supplied to VCO 218 (shown in FIG. 2). In one embodiment, input BN is coupled to the voltage across loop filter 216 (also shown in FIG. 2). The voltage on control voltage input BN also sets the input bias level of the inverting input IL of operation amplifier OP1, through transistor MP12.

Circuit portion 302 forms a current mirror, which sets the bias voltage on node BNC for controlling bias transistors MN1A and MN3A as a function of control voltage input BN. Circuit portion 303 converts these bias voltages from NMOS voltage bias levels to PMOS voltage bias levels on nodes BP and BPC. Transistors MP1A–MP4A provide a static VCO current to output OUT as a function of the bias voltages on nodes BP and BPC. Transistor MN13 is coupled as a large capacitor onto output OUT for smoothing the bias voltage on OUT.

Transistors MN7 and MN12 are coupled as capacitors coupled between ground terminal AVSS and bias node BNC and between AVSS and inverting input IL of operational amplifier OP1, respectively. Similarly, MP13 and MP14 are coupled as capacitors between power supply terminal AVDD and bias nodes BPC and BP, respectively.

Transistors MN11 and MP17 are used during power-down operations. Transistors MP5A and MP6A provide a pull-up voltage for the inverting input IL of operational amplifier OP1 as a function of the voltages on bias nodes BP and BPC, respectively. The non-inverting input IH of operational amplifier OP1 is coupled to output OUT such that OP1 operates as an inverting amplifier having unity gain, for example.

Each transistor in FIG. 4 is labeled with a width variable "W", a length variable "L", and a multiplication factor "M". The width and the length variables refer to the width and length of the channel in each transistor or array of transistors. The multiplication factor refers to the number of identical transistors that are coupled together in parallel. Therefore each transistor in FIG. 4 can include a single transistor or an array of multiple transistors coupled together in parallel. These values are provided as examples only, and can vary widely in alternative embodiments of the present invention. Also, the particular circuit configuration is provided only as an example and should no way be limiting.

As mentioned above, the transistors in circuit portion 301 are unused in voltage regulator 220 for configuration 300. Dashed lines 310–312 identify semiconductor devices that vary from one voltage regulator configuration to the next. In this configuration, transistors MN1A–MN4A and MP1A–MP6A are used and are therefore operatively coupled into the voltage regulator circuit through appropriate conductive segments in the metallization pattern. However, transistors MN2B–MN4B, MN1C–MN4C, MP1B–MP6B and MP1C–MP6C are unused and effectively decoupled from the circuit 220. All remaining semiconductor devices in circuit 220 are used in all voltage regulator configurations. In the second configuration, transistors MN1A–MN4A and MP1A–MP6B are replaced with transistors MN2B–MN4B and MP1B–MP6B, respectively, through changes in the metallization pattern with no changes to the base layer pattern of regulator 220. In the third configuration, transistors MN1A–MN4A and MP1A–MP6B are replaced with transistors MN1C–MN4C and MP1C–MP6C, respectively. This allows the lengths, widths and/or array sizes of the transistors to be changed with each configuration without changes to the base layers.

FIG. 5 is a schematic diagram illustrating the second voltage regulator configuration 320 according to one embodiment of the present invention. In this configuration, the same operational amplifier configuration OP1 is used. However, MN1A–MN4A and MP1A–MP6B have been replaced with transistors MN2B–MN4B and MP1B–MP6B. Transistors MN1A–MN4A and MP1A–MP6A are operatively decoupled from the voltage regulator circuit 220 and are now tied-off with the other unused transistors in circuit portion 301. These changes are made using only changes to the metallization pattern while leaving the base layer layout the overall voltage regulator circuit 220 unchanged.

FIG. 6 is a schematic diagram illustrating the third voltage regulator configuration 340, according to one embodiment of the present invention. In this configuration, operational amplifier 304 has a second configuration OP2 instead of the first configuration OP1. The changes between OP1 and OP2 are described in greater detail below with respect to FIGS. 7 and 8. Transistors MN1C–MN4C and MP1C–MP6C are operatively coupled into the regulator circuit while transistors MN1A–MN4A, MP1A–MP6A, MN2B–MN4B and MP1B–MP6B are operatively decoupled from the circuit.

Again, these changes are made solely through corresponding changes in the metallization patterns.

Figure 7:
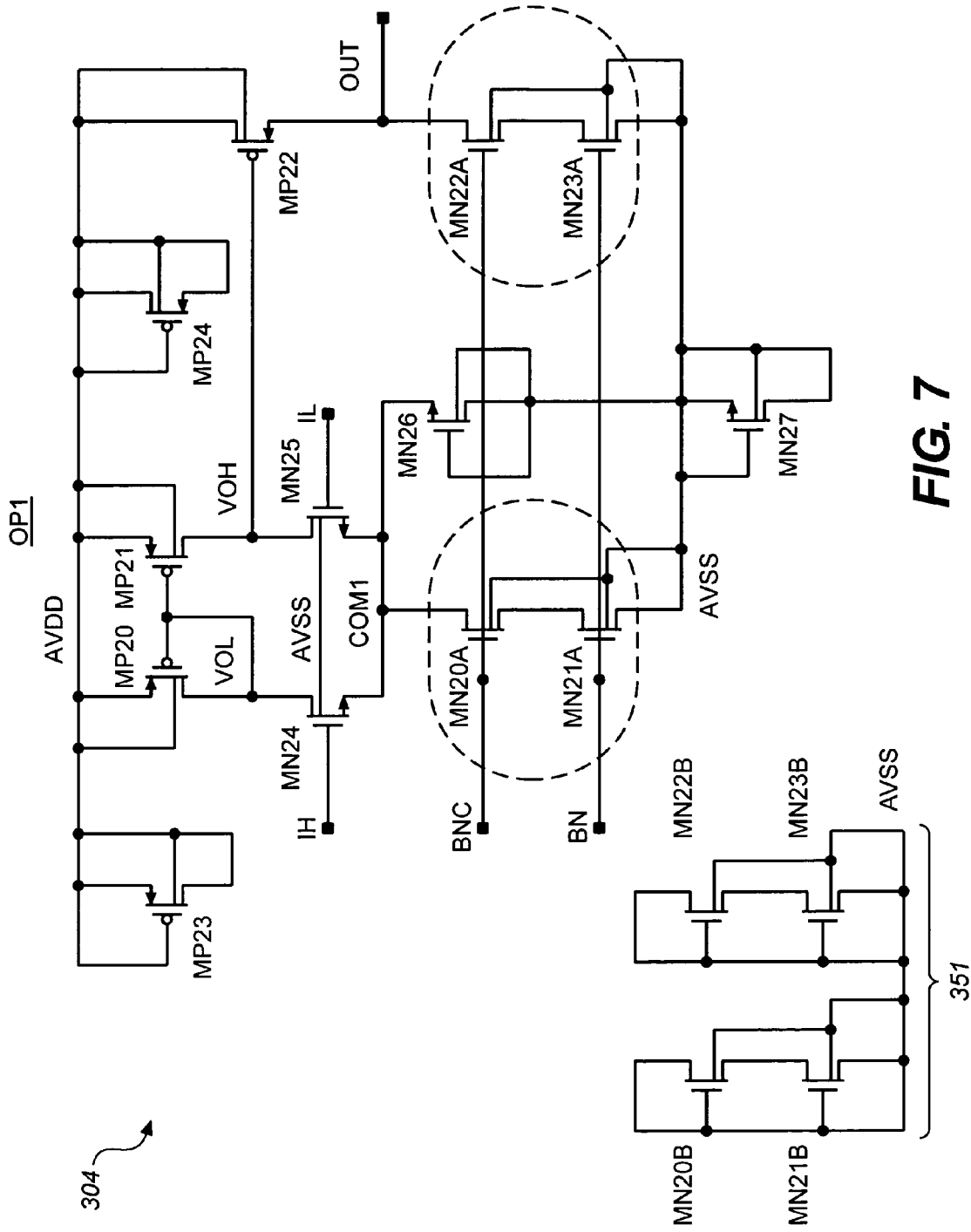
FIGS. 7–8 are schematic diagrams illustrating respective configurations of an operational amplifier used in the voltage regulator, according to one embodiment of the present invention.

FIG. 7 is a schematic diagram illustrating operational amplifier 304 in configuration OP1 in greater detail. Operational amplifier 304 includes bias voltage inputs BN and BNC, inverting input IL, non-inverting input IH, output OUT, N-Channel transistors MN20A–MN23A, MN20B–MN23B MN24–MN26, and P-Channel transistors MP20–MP24. Circuit portion 351 indicates those transistors that are unused in operational amplifier 304. In configuration OP1, transistors MN20B–MN23B are unused and are operatively decoupled from the circuit by the metallization pattern.

The remaining transistors are operatively coupled into the circuit. Transistors MN20A and MN21A form a current source for a differential amplifier formed by transistors MN24 and MN25, which are controlled by inputs IH and IL, respectively. Transistors MP20 and MP21 form pull-up bias transistors for the differential amplifier. Transistors MP22, MN22A and MN23A form an output driver for driving output OUT. Transistors MN26, MN27, MP23 and MP24 are dummy transistors. Transistors MN20A–MN23A have sizes that are selected to provide a desired change in output OUT for a given change in the difference between input IL and IH.

Figure 8:
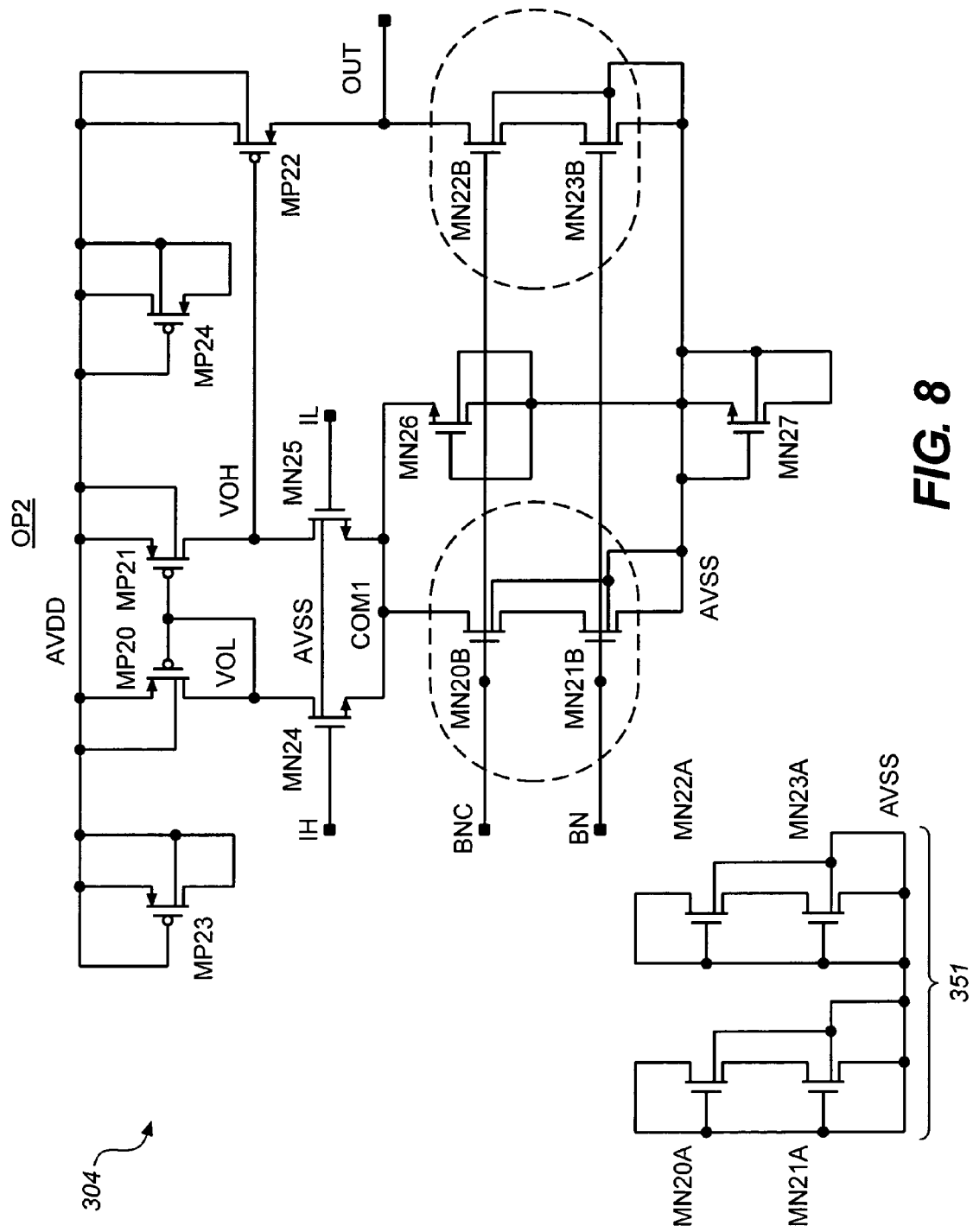

FIG. 8 is a schematic diagram illustrating configuration OP2 in greater detail, in accordance with one embodiment of the present invention. Configuration OP2 has the same base layer pattern as configuration OP1, but has a different metallization pattern. In configuration OP2, transistors MN20A–MN23A are replaced with transistors MN20B–MN23B. Transistors MN20B–MN23B are operatively coupled into the amplifier circuit, whereas transistors MN20A–MN23A are operatively decoupled from the amplifier circuit.

As shown in FIGS. 4–8, voltage regulator 220 is programmable into three configurations having three unique biasing levels and current outputs, according to one embodiment of the present invention. The three voltage regulator circuit configurations are integrated into one base layer layout that is modified in the metal layers. The three voltage regulator circuit configurations share most of the same elements, with the unique elements being coupled into the regulator or decoupled out of the regulator through changes in the metallization pattern.

Referring back to FIG. 2, each of the four PLL configurations has a unique buffering through clock buffer 222. Again, all needed components are included in the base layers of clock buffer 222 such that all clock buffer configurations are integrated into one common subcell. Changes between one configuration to the next are accomplished through respective changes to the metallization pattern of the subcell. Examples of four clock buffer configurations are shown in FIGS. 9–12. The same reference numerals are used in FIGS. 9–12 for the same or similar components.

Figure 9:
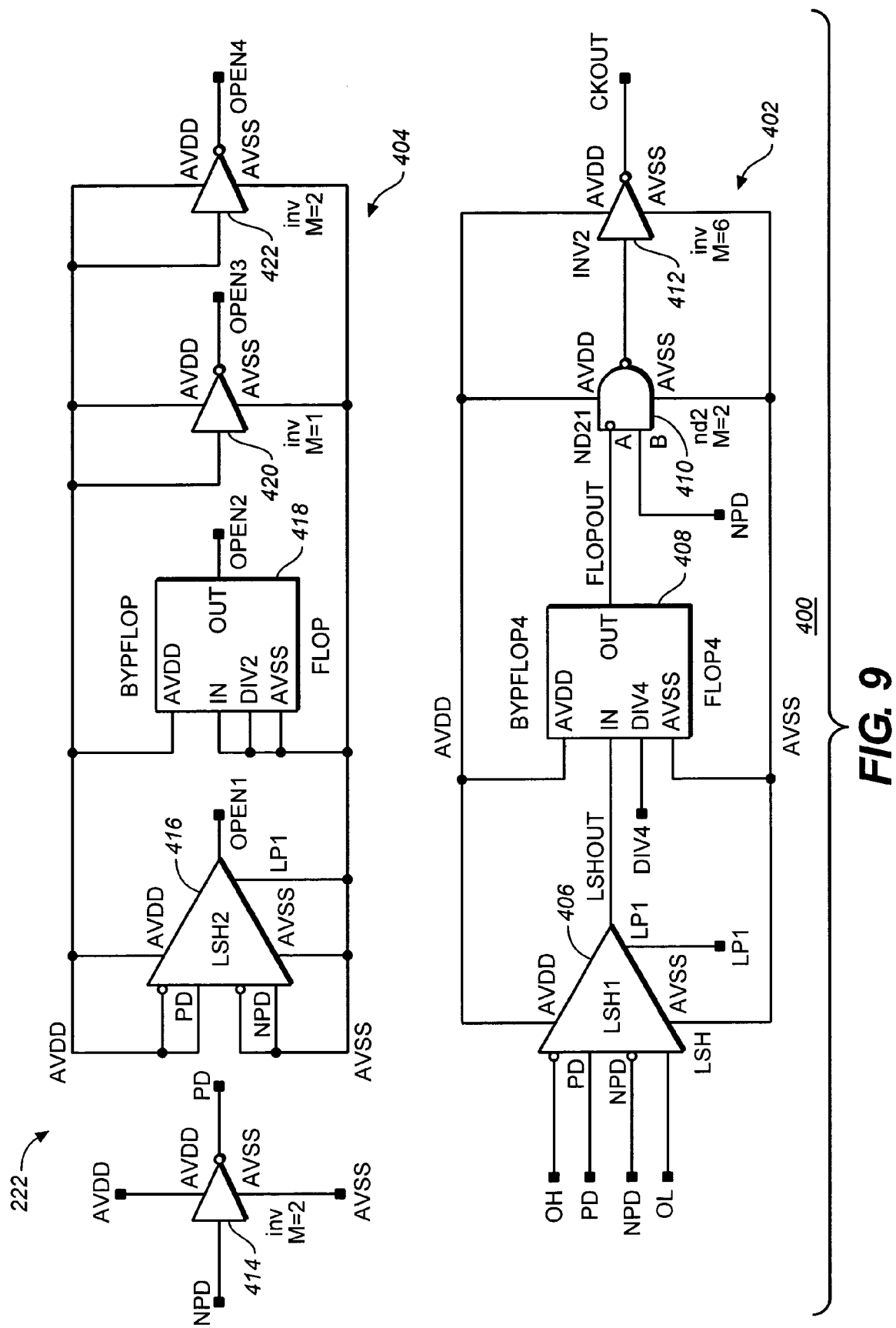
FIGS. 9–12 are schematic diagrams illustrating respective configurations of a clock buffer in the PLL cell, according to one embodiment of the present invention.

A first configuration 400 of clock buffer 222 is shown in FIG. 9. Configuration 400 includes a used circuit portion 402 and an unused circuit portion 404. Used circuit portion 402 includes a first level shifter (LSH1) 406, divide by four flip-flop 408, logic NAND gate 410 and inverter 412. Level shifter 406 has a pair of power-down control inputs PD and NPD, complementary clock inputs OL and OH, and an output LSHOUT. Complementary clock inputs OL and OH are coupled to corresponding complementary outputs of VCO 218 (shown in FIG. 2). Level shifter 406 converts the complementary clock input signals to a signal-ended output signal on LSHOUT, which is biased between the positive and negative voltage supply rails AVDD and AVSS.

Flip-flop 408 receives LSHOUT and divides the frequency of the signal by four. In one embodiment flip-flop 408 has a clock input coupled to a clock control input DIV4, which has a frequency that is one-fourth that of LSHOUT such that CKOUT is updated at one-fourth the frequency at the output of the VCO. The output of flip-flop 408 is coupled to the input of NAND gate 410, which is used for disabling CKOUT during power down. The output of NAND gate 410 is coupled to CKOUT through inverter 412.

Inverter 414 is coupled between power down inputs NPD and PD. Inverters 412 and 414 are common to all clock buffer configurations.

Unused section 404 includes a second level shifter (LSH2) 416, divide by two flip-flop 418, and inverters 420 and 422. These elements are tied-off between power and ground supply terminals AVDD and AVSS.

Figure 10:
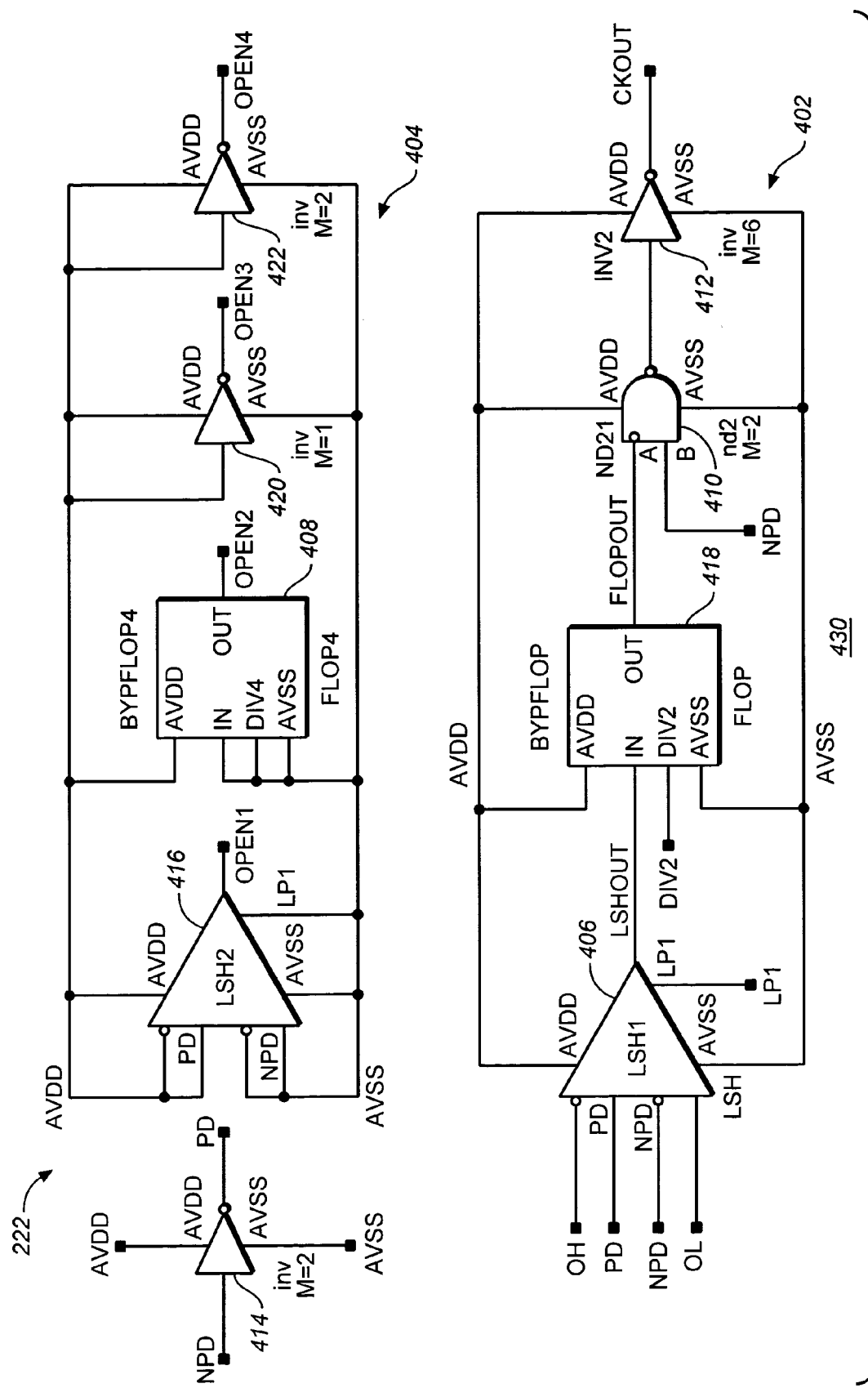

FIG. 10 is a schematic diagram illustrating a second clock buffer configuration 430 according to one embodiment of the present invention. In used circuit portion 402, divide by four flip-flop 408 has been replaced with divide by two flip-flop 418 through a change in the metallization pattern of clock buffer configuration 430 while leaving the base layer pattern of the clock buffer unchanged. Divide by four flip-flop 408 is now coupled in unused circuit portion 404. Divide by two flip-flop 418 is driven by a clock control input DIV2, which has a frequency that is one-half of the VCO output frequency.

Figure 11:
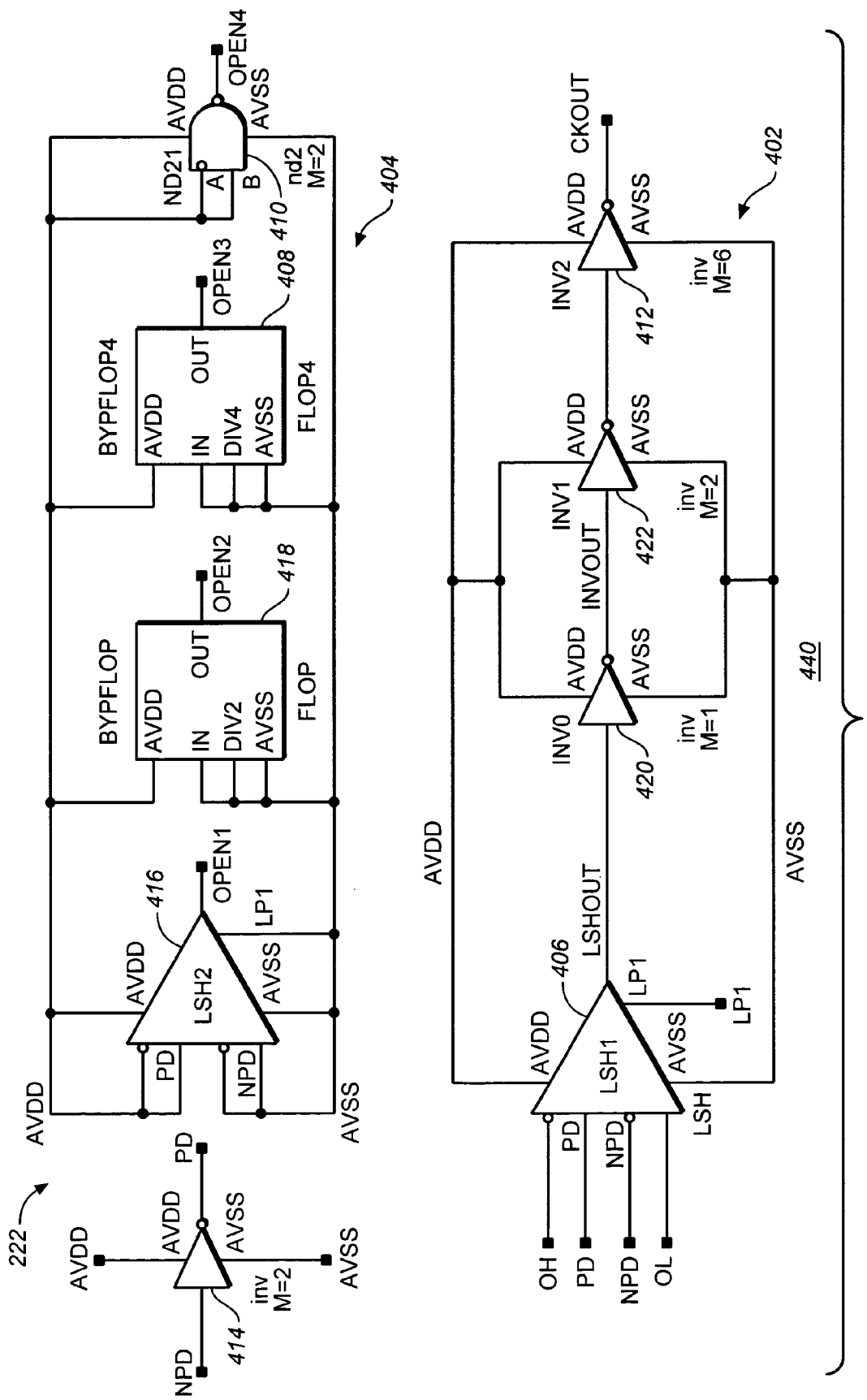

FIG. 11 is a schematic diagram, which illustrates a third clock buffer configuration 440. In this configuration, inverters 420 and 422 are operatively coupled within used circuit portion 402, and flip-flops 408 and 418 are operatively decoupled from circuit portion 402. Again, these changes are made through changes in the metallization pattern while leaving the base layer pattern of clock buffer 222 unchanged.

Figure 12:
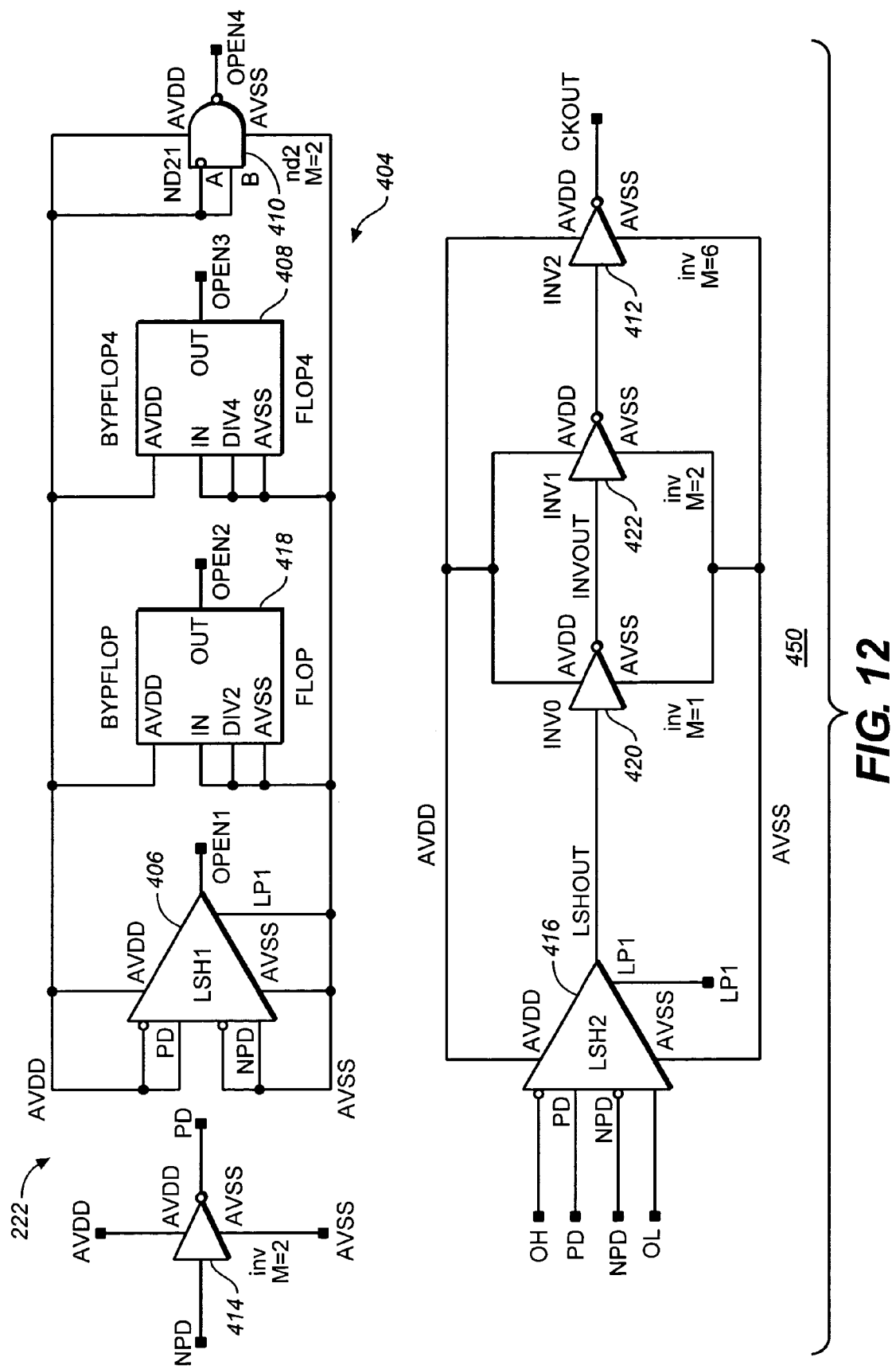

FIG. 12 is a schematic diagram illustrating a fourth clock buffer configuration 450. In this configuration, level shifter 416 and inverters 420 and 422 are operatively coupled into the clock buffer circuit, while level shifter 406, flip-flops 408 and 418 and NAND gate 410 are operatively decoupled from the circuit.

Each of the clock buffer configurations shown in FIGS. 9–12 can therefore provide unique output buffering while integrating all components into a common subcell that can be programmed through the metallization patterns.

FIGS. 13–16 are schematic diagrams illustrating PLL cell 200 in four circuit configurations using the subcell configurations shown in FIGS. 3–12, which share the same PLL base layer pattern but have different metallization patterns that can be selected to implement the desired configuration.

Figures 13, 13A:
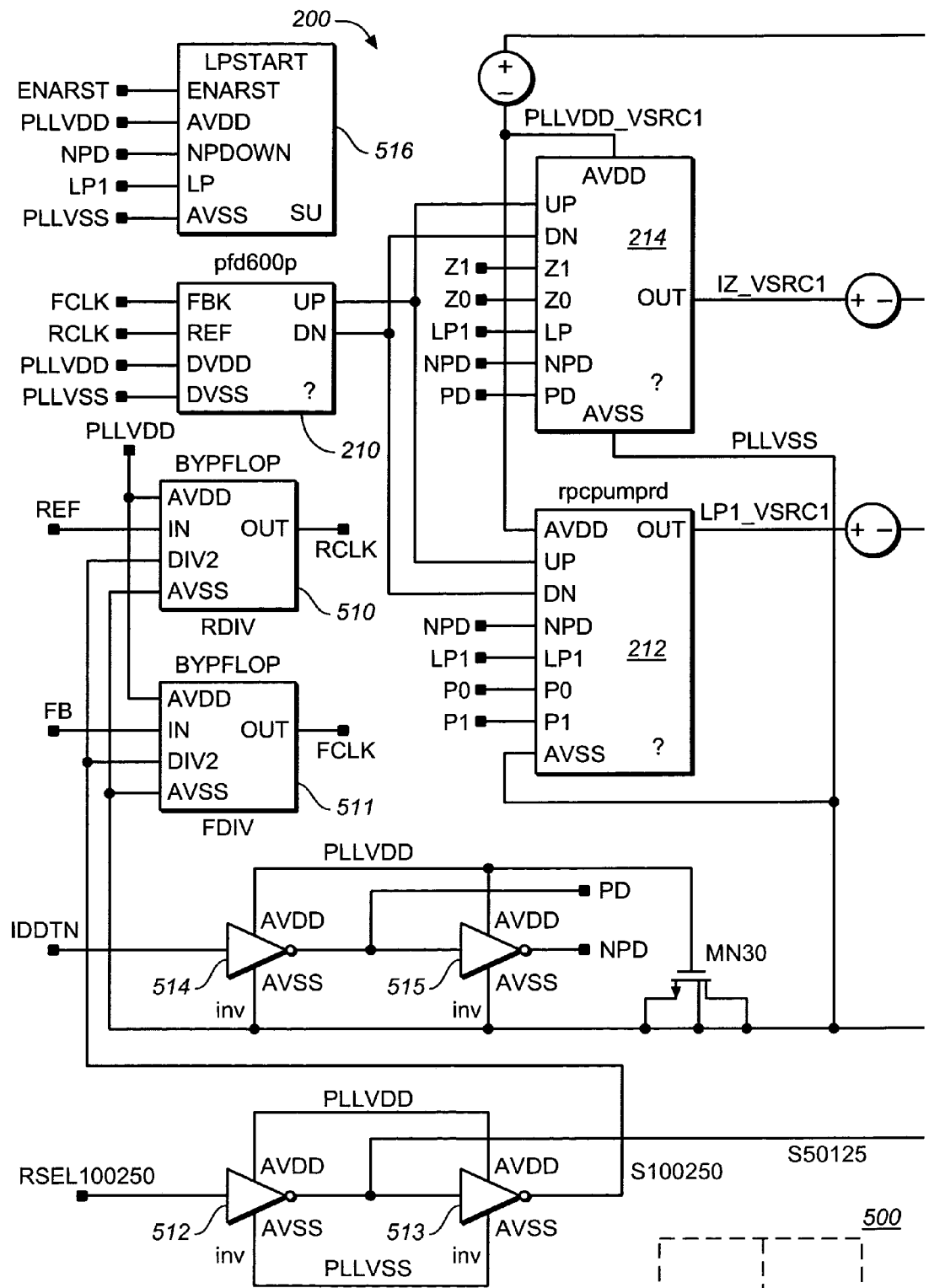
FIGS. 13–16 are schematic diagrams illustrating respective configurations of the PLL cell shown in FIG. 2 using the subcell configurations shown in FIGS. 3–12, according to one embodiment of the present invention.
Figure 13B:
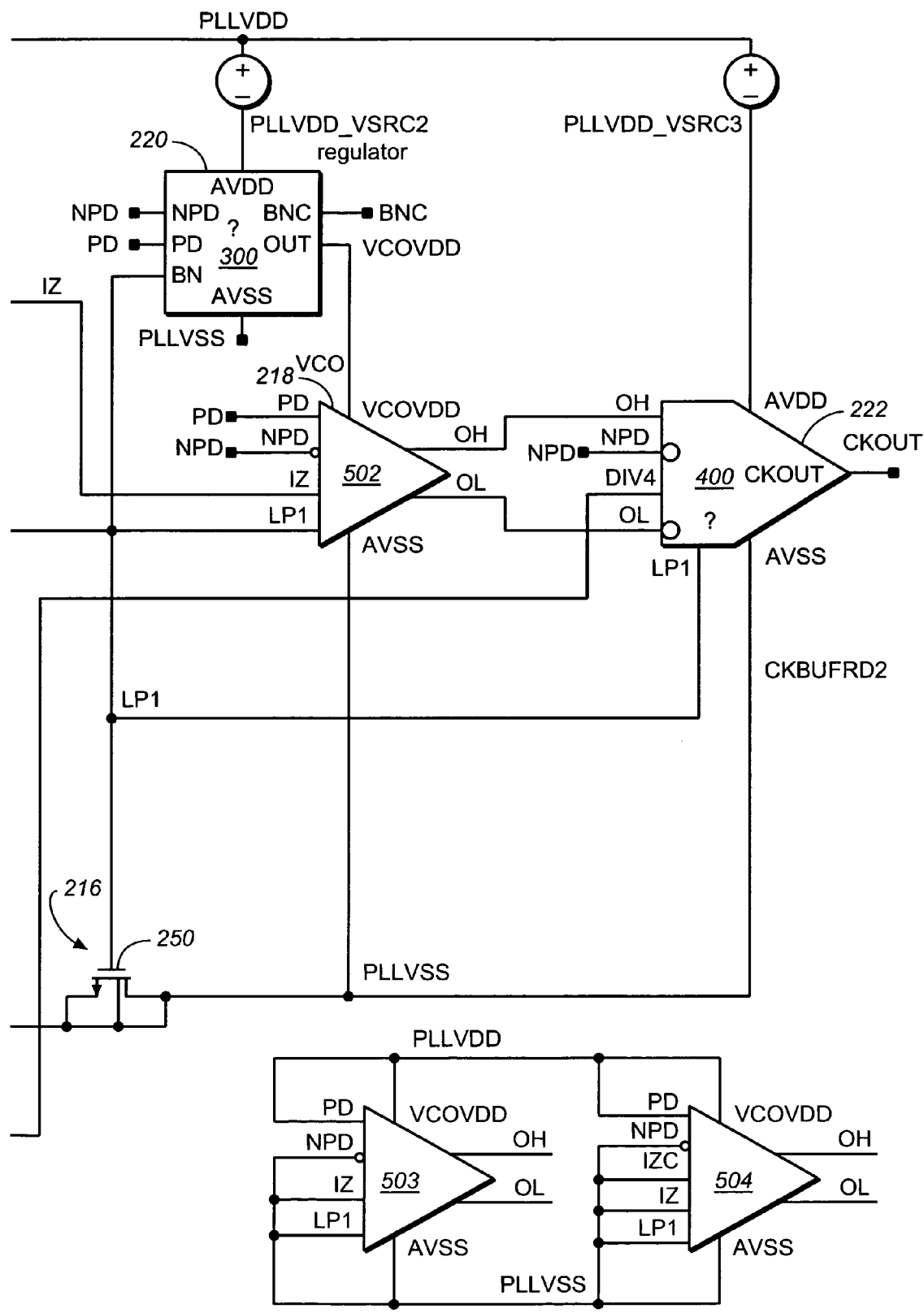

FIG. 13 shows PLL cell 200 in a first configuration 500. PLL cell 200 includes phase/frequency detector 210, charge pumps 212 and 214, loop filter 216, VCO 218 (with three unique VCO subcells 502, 503 and 504), voltage regulator 220 and clock buffer 222. In PLL configuration 500, VCO subcell 502 is operatively coupled into the PLL circuit, while unused VCO subcells 503 and 504 are tied-off to ground and operatively decoupled from the PLL circuit. Loop filter 216 includes the maximum number of loop filter capacitors 250, which are coupled in parallel with one another. In this embodiment, capacitors 250 have a multiplication factor of 700, indicating 700 transistors coupled together in parallel.

The additional components shown in FIG. 13 are common to all PLL configurations. Flip-flops 510 and 511 are used to selectively divide the frequencies of reference input REF and feedback input FB as a function of select signal RSEL100250, supplied through inverters 512 and 513. Inverters 514 and 515 are used to drive power-down signals PD and NPD as a function of drain current test input IDDTN. Control block 516, which is labeled LPSTART, is used to pull node LP1 up to a reference level upon start-up. Transistor MN30 is coupled as a capacitor between voltage supply rails PLVDD and PLVSS to operate as a power supply decoupling capacitance. Transistors MN30 have the same width and length as transistors 250 and have a multiplication factor of 446 in this example.

Figures 14, 14A, 14B:
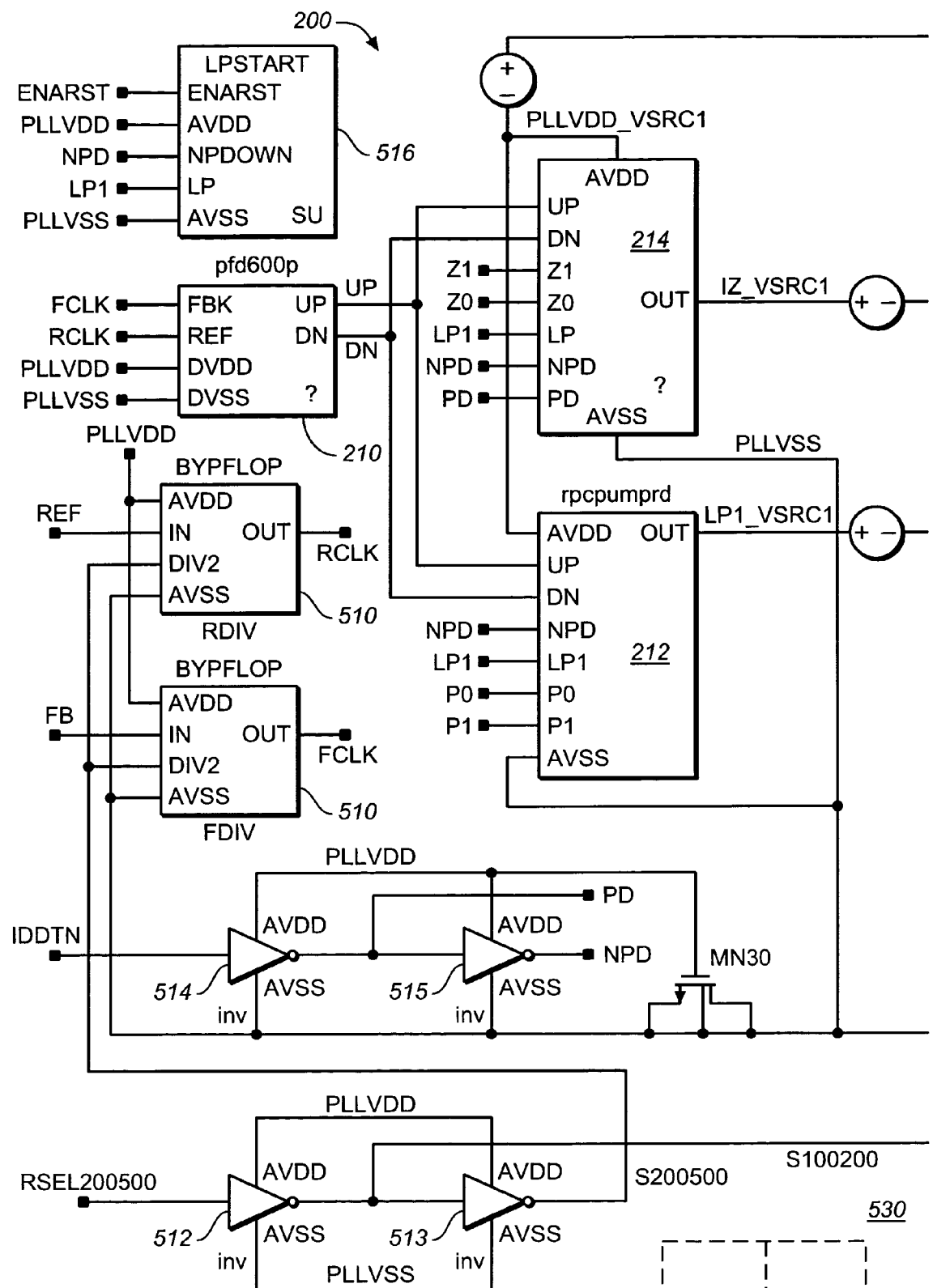
Figure 14B:
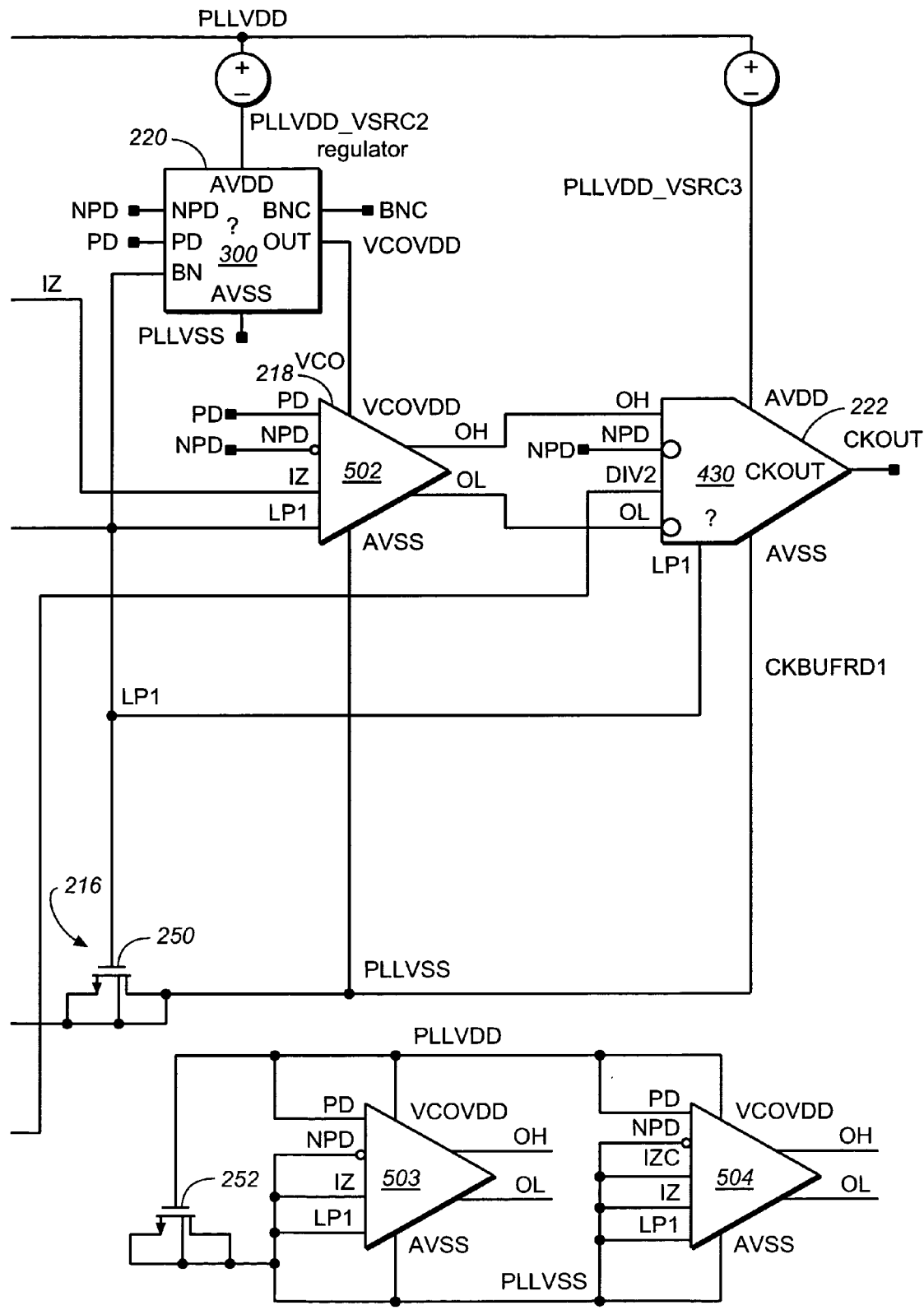

FIG. 14 is a schematic diagram illustrating a second PLL configuration 530. In this configuration, the metallization pattern of clock buffer 222 has been changed to implement configuration 430 (shown in FIG. 10), and half of the capacitively-coupled transistors 250 in loop filter 216 have been decoupled and re-coupled as power supply decoupling capacitors 252, between voltage supply rails PLLVDD and PLLVSS.

Figure 15A:
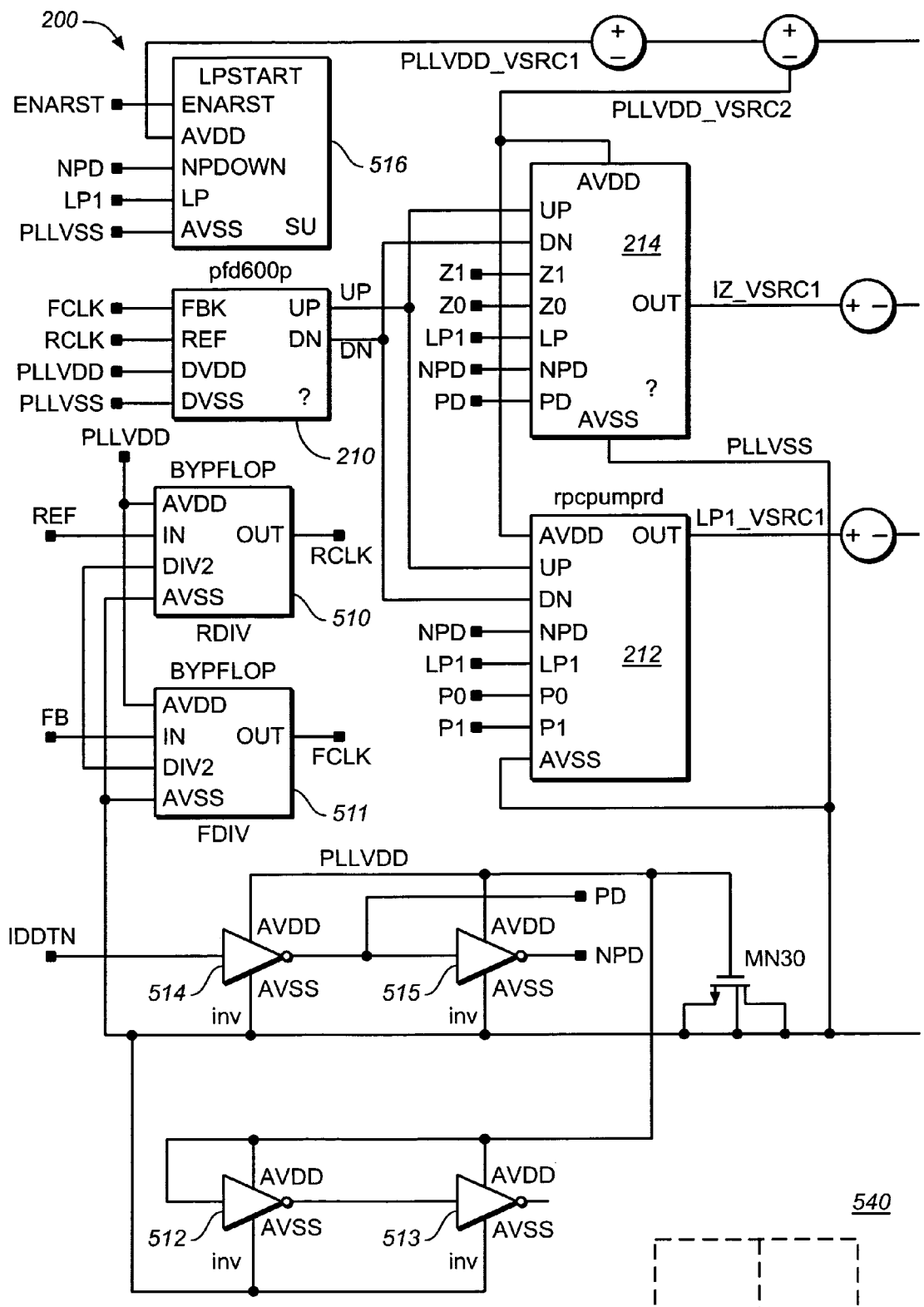
Figure 15B:
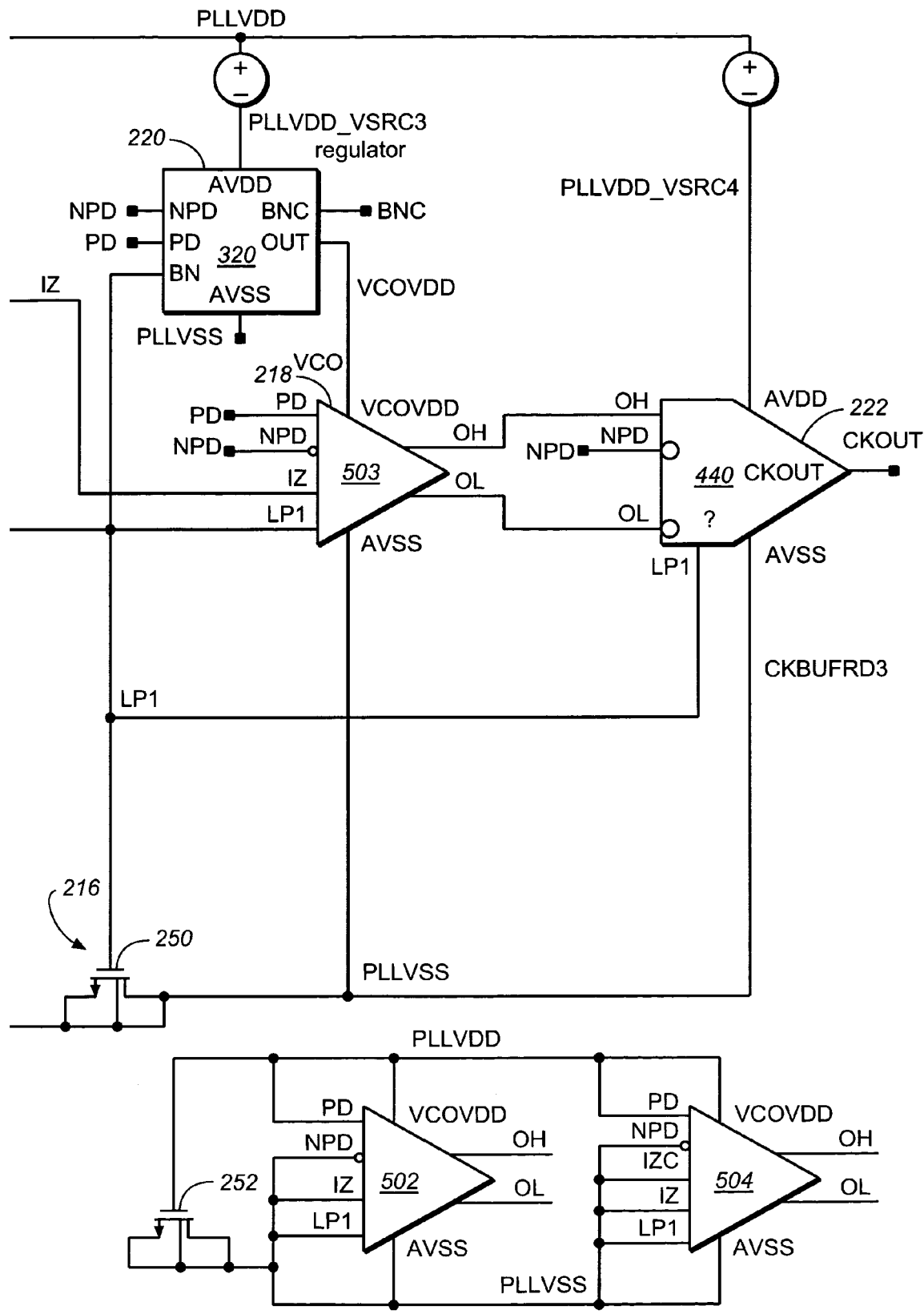

FIG. 15 is a schematic diagram illustrating a third PLL configuration 540 in which VCO subcell 503 is operatively coupled into the PLL circuit, and VCO subcells 502 and 504 are decoupled from the circuit. Voltage regulator 220 is implemented as voltage regulator configuration 320 (shown in FIG. 5), and clock buffer 222 is implemented as clock buffer configuration 440 (shown in FIG. 11). Loop filter 216 includes 350 capacitively-coupled transistors 250 connected together in parallel, while the remaining, unused 350 transistors 252 are coupled as power supply decoupling capacitors.

Figures 16, 16A:
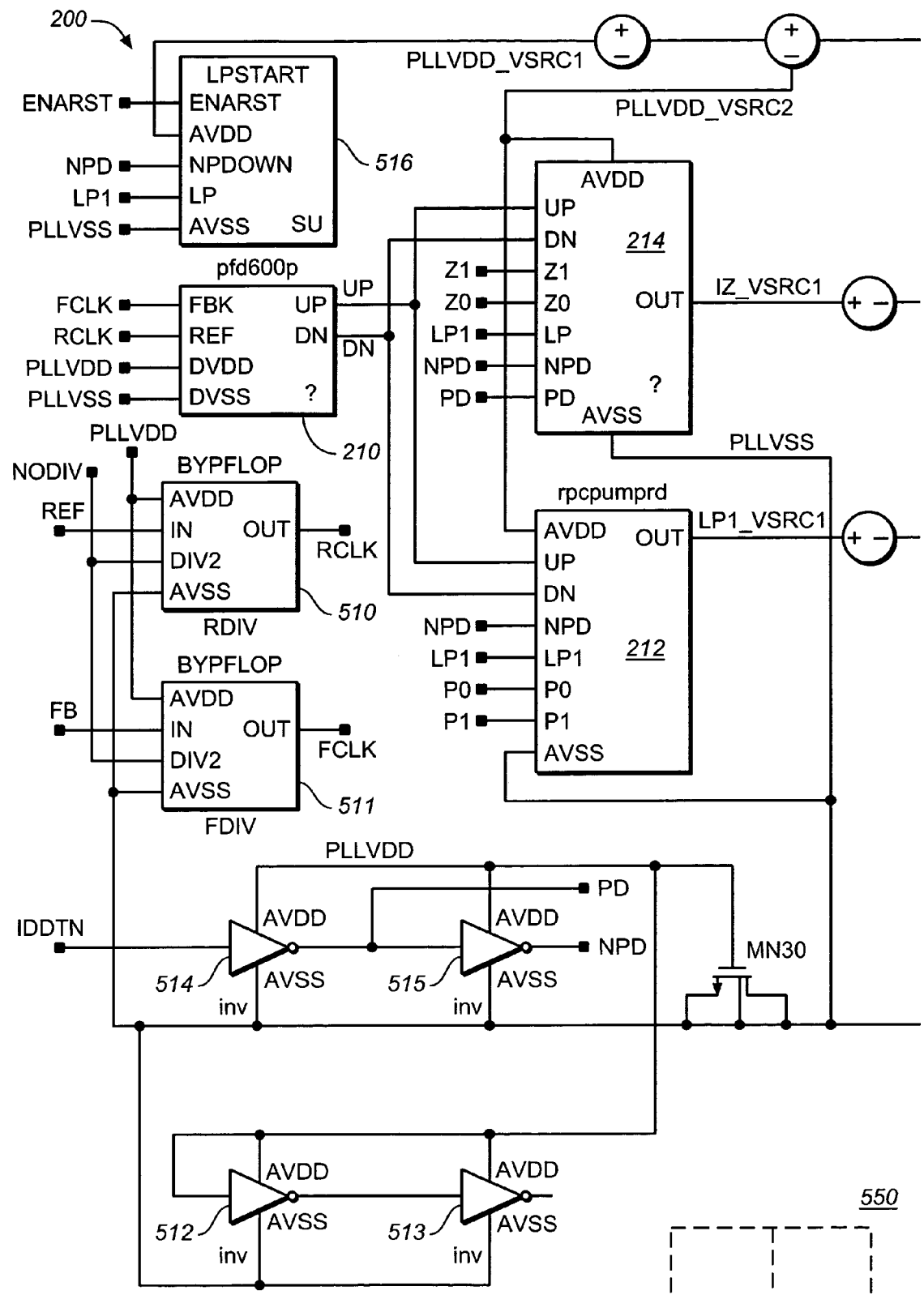
Figure 16B:
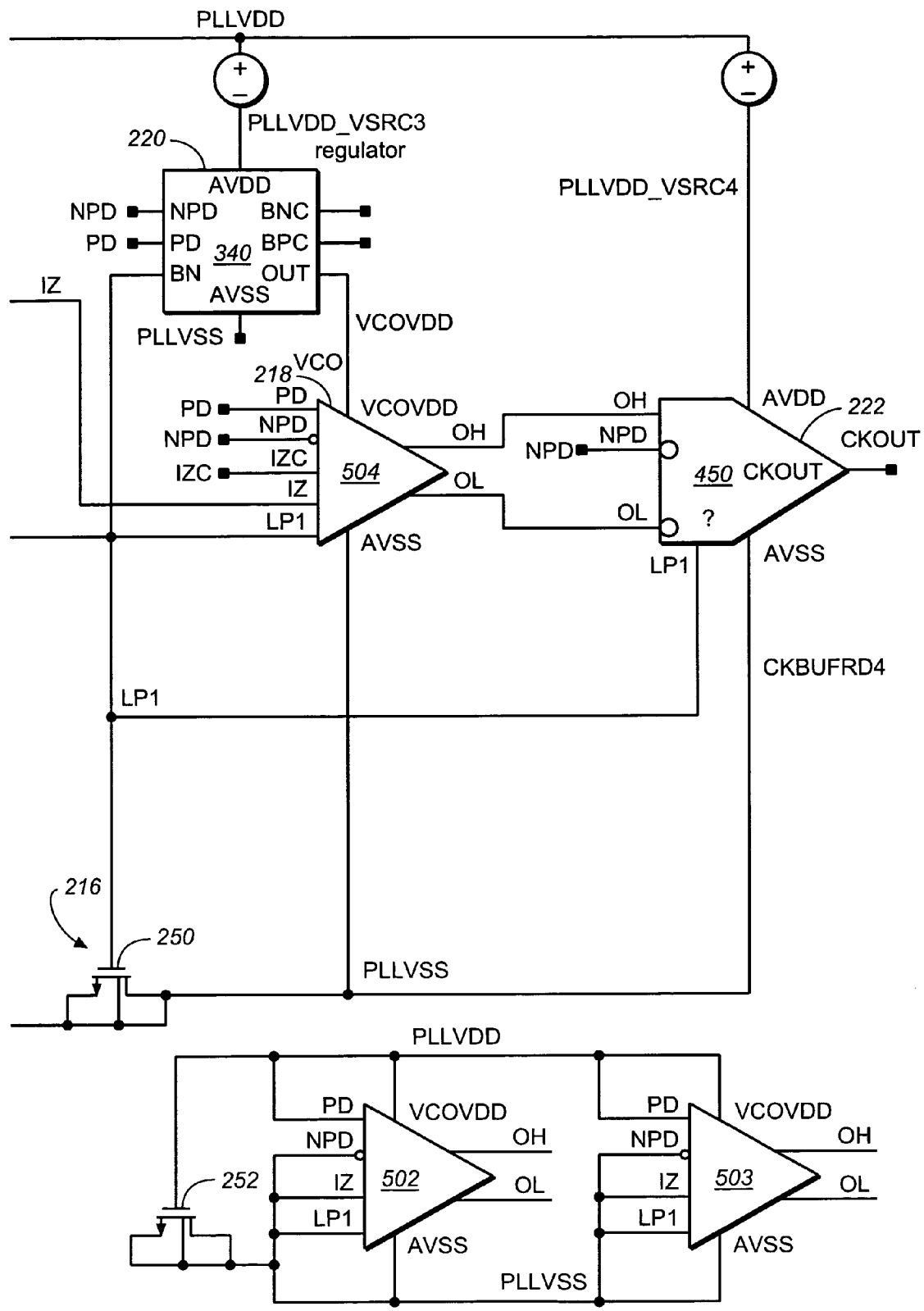

FIG. 16 is a schematic diagram, which illustrates a fourth PLL configuration 550 according to one embodiment of the present invention. In this configuration, VCO subcell 504 is operatively coupled in the PLL circuit while VCO subcells 502 and 503 are operatively decoupled from the circuit. Voltage regulator 220 is implemented as voltage regulator configuration 340 (shown in FIG. 6), and clock buffer 222 is implemented as configuration 450 (shown in FIG. 12). Loop filter 216 includes 150 capacitively-coupled transistors 250, while the remaining 550 unused transistors 252 are coupled as power supply decoupling capacitors.

As mentioned above, the selection between PLL configurations 500, 530, 540 and 550 is programmable through the metallization patterns without requiring a change to the base layers of the PLL cell. This allows the performance and operating characteristics of the PLL to be programmable from one implementation to the next without requiring a change to the base layers. In the examples shown in FIGS. 13–16, PLL configuration 500 has an output frequency range of 50–250 MHz, PLL configuration 530 has an output frequency range of 100–500 MHz, PLL configuration 540 has an output frequency range of 300–700 MHz and PLL configuration 550 has an output frequency range of 600–1250 MHz. Other frequency ranges and operating characteristics can also be used. In addition, the circuit diagrams shown in the above figures are provided as examples only. Other circuit configurations can also be used, wherein one or more of the operating characteristics of the PLL is programmable through one or more of the metal routing or via layers.

Although the present invention has been described with reference to preferred embodiments, workers skilled in the art will recognize that changes may be made in form and detail without departing from the spirit and scope of the invention. The term "coupled" as used in the specification and in the claims can include a direct connection or a connection through one or more additional components.

What is claimed is:

1. A phase-locked loop within an integrated circuit assembly, the phase-locked loop comprising:
    a plurality of subcells of semiconductor devices arranged in a base layer pattern on base layers of the integrated circuit assembly, wherein the plurality of subcells comprises a plurality of voltage-controlled oscillator (VCO) subcells, wherein each VCO subcell has a different oscillating frequency range; and
    one or more metal layers formed over and interconnecting the plurality of semiconductor devices in a metallization pattern, which operatively couples one of the VCO subcells into the phase-locked loop and operatively decouples the other VCO subcells from the phase-locked loop, wherein the phase-locked loop has an output frequency range that is changeable with a change to the metallization pattern without a corresponding change to the base layer pattern.

2. The phase-locked loop of claim 1 wherein the plurality of subcells comprises a loop filter subcell, which comprises a plurality of loop filter capacitors and wherein the metallization pattern operatively couples a selected number of the loop filter capacitors into the phase-locked loop and operatively decouples any remaining ones of the loop filter capacitors out of the phase-locked loop such that the loop filter has an effective capacitance that is selectable with the metallization pattern.

3. The phase-locked loop of claim 1 wherein the plurality of subcells comprises a clock buffer subcell, which drives a clock output from the phase-locked loop, wherein the clock buffer subcell comprises a plurality of clock buffer circuit configurations, which are selectable with the metallization pattern.

4. The phase-locked loop of claim 3 wherein, for each of the clock buffer configurations, the metallization pattern operatively couples a first subset of the semiconductor devices in the clock buffer subcell to implement a corresponding clock buffer function and operatively decouples a second, different subset of the semiconductor devices in the clock buffer subcell.

5. The phase-locked loop of claim 4 wherein the clock buffer function comprises a frequency divider having a divisor that is selectable with the metallization pattern.

6. The phase-locked loop of claim 4 wherein the clock buffer function comprises a voltage level shifter having an output drive power and an output switching speed that are selectable with the metallization pattern.

7. The phase-locked loop of claim 1 wherein the plurality of subcells comprises:
    a voltage-controlled oscillator subcell;
    a voltage regulator subcell, which biases the voltage-controlled oscillator subcell and comprises a plurality of voltage regulator circuit configurations, which are selectable with the metallization pattern, wherein for each of the voltage regulator circuit configurations, the metallization pattern operatively couples a first subset of the semiconductor devices in the voltage regulator subcell and operatively decouples a second, different subset of the semiconductor devices.

8. A phase-locked loop (PLL) cell for fabrication on an integrated circuit, the cell definition comprising:
    a first PLL configuration formed by a first plurality of subcells, wherein each of the first plurality of subcells comprises a base layer pattern and a metallization pattern; and
    a second PLL configuration formed by a second plurality of subcells, wherein at least one of the second plurality of subcells is common with a corresponding one of the first plurality of subcells and has the same base layer pattern and the same metallization pattern, wherein at least another one of the second plurality of subcells is common with a corresponding one of the first plurality of subcells and has the same base layer pattern and a different metallization pattern, and wherein the second plurality of subcells further comprises at least one subcell that has a different base layer pattern and a different metallization pattern than a corresponding one of the first plurality of subcells.

9. The PLL cell of claim 8 wherein the phase-locked loop comprises a phase-frequency detector subcell, which is common to the first plurality of subcells and the second plurality of subcells and has the same base layer pattern and metallization pattern in the first and second PLL configurations.

10. The PLL cell of claim 8 wherein the phase-locked loop comprises a charge pump subcell, which is common to the first plurality of subcells and the second plurality of subcells and has the same base layer pattern and metallization pattern in the first and second PLL configurations.

11. The PLL cell of claim 8 wherein the first plurality of subcells comprises a first voltage-controlled oscillator subcell and the second plurality of subcells comprises a second voltage-controlled oscillator subcell, which has a different base layer pattern and a different metallization pattern than the first voltage-controlled oscillator subcell.

12. The PLL cell of claim 8 wherein the phase-locked loop comprises a loop filter subcell, which is common to the first plurality of subcells and the second plurality of subcells and comprises a plurality of loop filter capacitors, wherein the loop filter subcell has a first metallization pattern in the first PLL configuration and a second, different metallization pattern in the second PLL configuration, and wherein the first and second metallization patterns operatively couple respective numbers of the loop filter capacitors into the phase-locked loop and operatively decouple remaining ones of the loop filter capacitors out of the phase-locked loop such that the loop filter subcell has an effective capacitance that is selectable with the first and second metallization patterns.

13. The PLL cell of claim 8 wherein the phase-locked loop comprises:
    a voltage-controlled oscillator subcell; and
    a voltage regulator subcell, which is common to the first plurality of subcells and the second plurality of subcells and has the same base layer pattern and different metallization patterns in the first and second PLL configurations, wherein the metallization pattern in the first PLL configuration operatively couples a first set of semiconductor devices in the base layer pattern into the voltage regulator subcell and the metallization pattern in the second PLL configuration operatively couples a second, different set of semiconductor devices in the base layer pattern into the voltage regulator subcell.

14. The PLL cell of claim 8 wherein the phase-locked loop comprises a clock buffer subcell which is common to the first plurality of subcells and the second plurality of subcells and has the same base layer pattern and different metallization patterns in the first and second PLL configurations, wherein the metallization pattern in the first PLL configuration operatively couples a first set of semiconductor devices in the base layer pattern into the clock buffer subcell and the metallization pattern in the second PLL configuration operatively couples a second, different set of semiconductor devices in the base layer pattern into the clock buffer subcell.

15. A phase-locked loop within an integrated circuit assembly, the phase-locked loop comprising:
a plurality of subcells of semiconductor devices arranged in a base layer pattern on base layers of the integrated circuit assembly, wherein the plurality of subcells comprises a loop filter subcell, which comprises a plurality of loop filter capacitors; and
one or more metal layers formed over and interconnecting the plurality of semiconductor devices in a metallization pattern, which operatively couples a selected number of the loop filter capacitors into the phase-locked loop and operatively decouples any remaining ones of the loop filter capacitors out of the phase-locked loop such that the loop filter has an effective capacitance that is selectable with the metallization pattern, wherein the phase-locked loop has an output frequency range that is changeable with a change to the metallization pattern without a corresponding change to the base layer pattern.

16. A phase-locked loop within an integrated circuit assembly, the phase-locked loop comprising:
a plurality of subcells of semiconductor devices arranged in a base layer pattern on base layers of the integrated circuit assembly, wherein the plurality of subcells comprises a clock buffer subcell, which drives a clock output from the phase-locked loop; and
one or more metal layers formed over and interconnecting the plurality of semiconductor devices in a metallization pattern, wherein the clock buffer subcell comprises a plurality of clock buffer circuit configurations, which are selectable with the metallization pattern, and wherein the phase-locked loop has an output frequency range that is changeable with a change to the metallization pattern without a corresponding change to the base layer pattern.

* * * * *